(12) United States Patent
Chang et al.

(10) Patent No.: US 12,283,586 B2
(45) Date of Patent: Apr. 22, 2025

(54) INTEGRATED CIRCUIT DEVICE, METHOD AND SYSTEM

(71) Applicant: TAIWAN SEMICONDUCTOR MANUFACTURING COMPANY, LTD., Hsinchu (TW)

(72) Inventors: Wei-Ling Chang, Hsinchu (TW);
Chih-Liang Chen, Hsinchu (TW);
Hui-Zhong Zhuang, Hsinchu (TW);
Chia-Tien Wu, Hsinchu (TW);
Jia-Hong Gao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 429 days.

(21) Appl. No.: 17/462,974

(22) Filed: Aug. 31, 2021

(65) Prior Publication Data
US 2023/0067734 A1  Mar. 2, 2023

(51) Int. Cl.
*H01L 27/02* (2006.01)
*G06F 30/392* (2020.01)
*H01L 21/768* (2006.01)
*H01L 23/522* (2006.01)
*H01L 23/528* (2006.01)
*H01L 27/118* (2006.01)

(52) U.S. Cl.
CPC ........ *H01L 27/0207* (2013.01); *G06F 30/392* (2020.01); *H01L 21/76898* (2013.01); *H01L 23/5226* (2013.01); *H01L 23/528* (2013.01); *H01L 27/11807* (2013.01)

(58) Field of Classification Search
CPC .............. H01L 27/0207; H01L 23/528; H01L 27/11807; G06F 30/392
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 9,691,695 B2 * | 6/2017 | Guo | ...................... H01L 23/498 |
| 11,755,809 B2 * | 9/2023 | Yu | .......................... G06F 30/392 |
| | | | 716/120 |
| 2014/0040838 A1 | 2/2014 | Liu et al. | |
| 2015/0278429 A1 | 10/2015 | Chang | |

(Continued)

*Primary Examiner* — Mounir S Amer
*Assistant Examiner* — Alexander Belousov
(74) *Attorney, Agent, or Firm* — Hauptman Ham, LLP

(57) ABSTRACT

An integrated circuit (IC) device includes a circuit region, a lower metal layer over the circuit region, and an upper metal layer over the lower metal layer. The lower metal layer includes a plurality of lower conductive patterns elongated along a first axis. The upper metal layer includes a plurality of upper conductive patterns elongated along a second axis transverse to the first axis. The plurality of upper conductive patterns includes at least one input or output configured to electrically couple the circuit region to external circuitry outside the circuit region. The upper metal layer further includes a first lateral upper conductive pattern contiguous with and projecting, along the first axis, from a first upper conductive pattern among the plurality of upper conductive patterns. The first lateral upper conductive pattern is over and electrically coupled to a first lower conductive pattern among the plurality of lower conductive patterns.

20 Claims, 20 Drawing Sheets

(56) References Cited

U.S. PATENT DOCUMENTS

| | | | |
|---|---|---|---|
| 2017/0345809 A1* | 11/2017 | Chang | H01L 27/0207 |
| 2018/0365368 A1* | 12/2018 | Do | H01L 27/0207 |
| 2023/0067734 A1* | 3/2023 | Chang | G06F 30/394 |
| 2023/0223319 A1* | 7/2023 | Do | H01L 23/485 |
| | | | 257/774 |
| 2023/0261002 A1* | 8/2023 | Wang | H01L 27/11807 |
| | | | 257/207 |
| 2023/0268339 A1* | 8/2023 | Wang | H01L 27/0617 |
| | | | 257/288 |

* cited by examiner

INTEGRATED CIRCUIT DEVICE, METHOD AND SYSTEM

BACKGROUND

An integrated circuit ("IC") device includes one or more semiconductor devices represented in an IC layout diagram (also referred to as "layout diagram"). A layout diagram is hierarchical and includes modules which carry out higher-level functions in accordance with the semiconductor device's design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization. Routing and placing is where the different devices in a device are connected. One of the goals of routing and placing in a layout is to reduce the amount of routing required and thereby improve power and space consumed by a semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
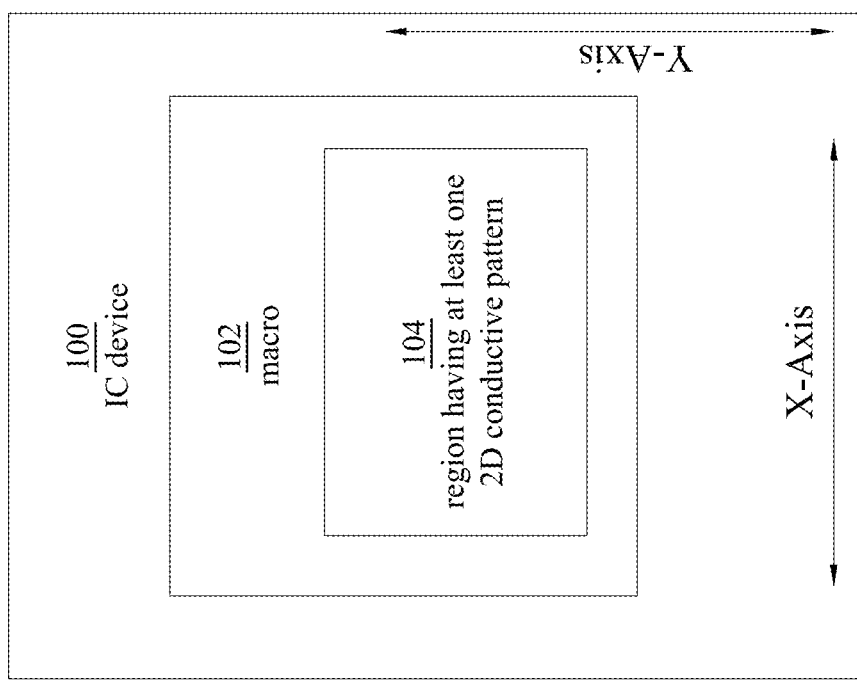
FIG. 1 is a block diagram of an IC device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An IC device comprises various metal layers with corresponding conductive patterns for coupling or routing various circuitry of the IC device. Generally, conductive patterns in a metal layer are elongated along the same axis or direction. Such conductive patterns are sometimes referred to as one-dimensional (1D) conductive patterns. In some embodiments, a metal layer comprises at least one two-dimensional (2D) conductive pattern which has a first portion elongated along a first axis like other 1D conductive patterns in the metal pattern, and a second portion elongated along a second axis transverse to the first axis. In some embodiments, the metal layer having a 2D conductive pattern is electrically coupled to an underlying metal layer by three or more consecutive vias. In at least one embodiment, the metal layer having a 2D conductive pattern is the metal-one (M1) layer, and/or the three or more consecutive vias are in the via-zero (VIA0 or V0) layer of an IC device. In at least one embodiment, using one or more 2D conductive patterns in a metal layer for routing make it possible to reduce the width (also referred to as "cell pitch") and/or to improve gate density of a circuit region of the IC device, compared to other approaches where 2D conductive patterns are not used. In at least one embodiment, similar advantages are achievable by using one or more 2D conductive patterns in a metal layer together with three or more consecutive vias in an underlying via layer for routing.

FIG. 1 is a block diagram of an IC device 100, in accordance with some embodiments.

In FIG. 1, the IC device 100 comprises, among other things, a macro 102. In some embodiments, the macro 102 comprises one or more of a memory, a power grid, a cell or cells, an inverter, a latch, a buffer and/or any other type of circuit arrangement that may be represented digitally in a cell library. In some embodiments, the macro 102 is understood in the context of an analogy to the architectural hierarchy of modular programming in which subroutines/ procedures are called by a main program (or by other subroutines) to carry out a given computational function. In this context, the IC device 100 uses the macro 102 to perform one or more given functions. Accordingly, in this context and in terms of architectural hierarchy, the IC device 100 is analogous to the main program and the macro 102 is analogous to subroutines/procedures. In some embodiments, the macro 102 is a soft macro. In some embodiments, the macro 102 is a hard macro. In some embodiments, the macro 102 is a soft macro which is described digitally in register-transfer level (RTL) code. In some embodiments, synthesis, placement and routing have yet to have been performed on the macro 102 such that the soft macro can be synthesized, placed and routed for a variety of process nodes. In some embodiments, the macro 102 is a hard macro which is described digitally in a binary file format (e.g., Graphic Database System II (GDSII) stream format), where the binary file format represents planar geometric shapes, text labels, other information and the like of one or more layout-diagrams of the macro 102 in hierarchical form. In some embodiments, synthesis, placement and routing have been performed on the macro 102 such that the hard macro is specific to a particular process node.

The macro 102 includes a region 104, which comprises at least one 2D conductive pattern. In some embodiments, the region 104 comprises a semiconductor substrate having circuitry formed thereon, in a front-end-of-line (FEOL) fabrication. Furthermore, above and/or below the semiconductor substrate, the region 104 comprises various metal layers that are stacked over and/or under insulating layers in a Back End of Line (BEOL) fabrication. The BEOL provides routing for circuitry of the IC device 100, including the macro 102 and the region 104. The metal layers comprise conductive patterns that extend in a first direction (e.g., along an X-axis) or in a second direction (e.g., along a Y-axis) transverse to the first direction. In some embodiments, the first direction is orthogonal to the second direction. At least one metal layer in the region 104 comprises only 1D conductive patterns that extend, or are elongated, in only either the first direction (i.e., have a long or lengthwise axis that extends in the first direction) or the second direction (i.e., have a long or lengthwise axis that extends in the second direction). A further metal layer in the region 104 comprises not only 1D conductive patterns, but also at least one 2D conductive pattern, as described herein.

Figure 2:
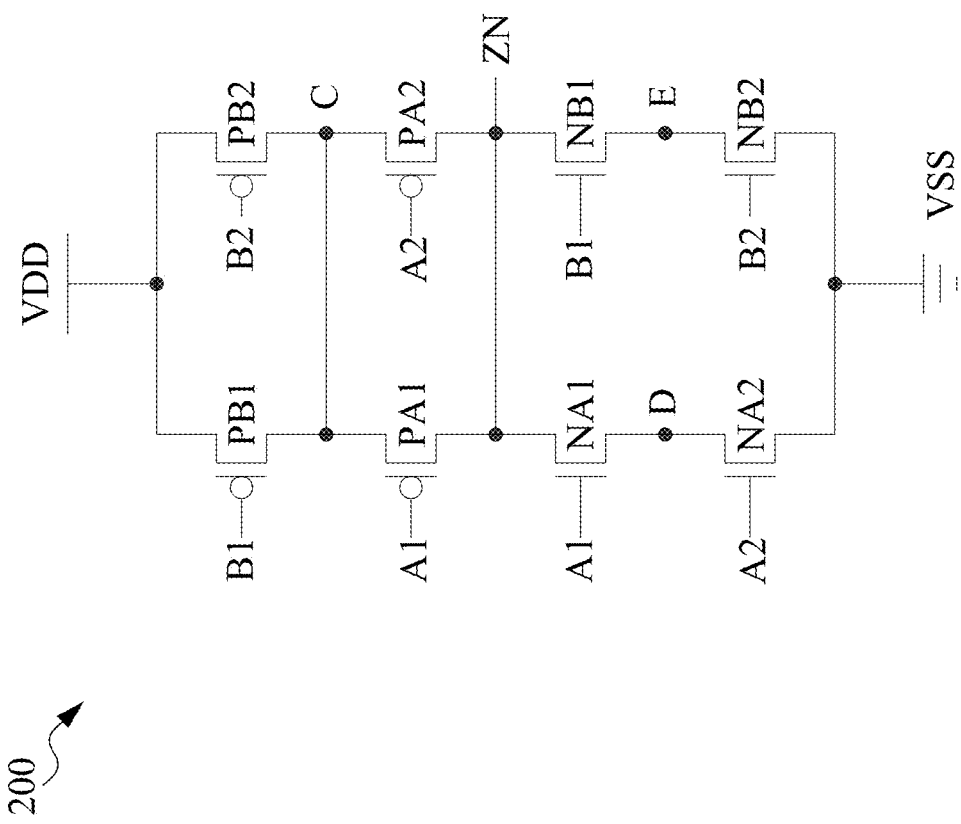
FIG. 2 is a schematic circuit diagram of a circuit region of an IC device, in accordance with some embodiments.

FIG. 2 is a schematic circuit diagram of a circuit region 200 of an IC device, in accordance with some embodiments. In at least one embodiment, the circuit region 200 corresponds to a portion of the region 104 in FIG. 1. In the example configuration in FIG. 2, the circuit region 200 comprises an AND-OR-Invert (AOI) logic with two 2-input AND gates corresponding to a standard cell sometimes referred to as an AOI22D1 cell. Other example circuit regions or standard cells included in the region 104 include, but are not limited to, AND, OR, NAND, NOR, XOR, INV, OR-AND-Invert (OAI), MUX, Flip-flop, BUFF, Latch, delay, clock, memory, or the like.

The circuit region 200 comprises inputs A1, A2, B1, B2, an output ZN, and a plurality of transistors PA1, PA2, PB1, PB2, NA1, NA2, NB1, NB2 electrically coupled together to perform, in operation, a predetermined function of the circuit region 200. Examples of transistors in the circuit region 200 include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. In the example configuration in FIG. 2, the circuit region 200 comprises PMOS transistors PA1, PA2, PB1, PB2 and NMOS transistors NA1, NA2, NB1, NB2.

Gates of the transistors PA1, NA1 are electrically coupled to the input A1. Gates of the transistors PA2, NA2 are electrically coupled to the input A2. Gates of the transistors PB1, NB1 are electrically coupled to the input B1. Gates of the transistors PB2, NB2 are electrically coupled to the input B2.

Sources of the transistors PB1, PB2 are electrically coupled to a first node (or rail) of a first power supply voltage. The first node (or rail) and the first power supply voltage are commonly referred to herein as VDD. Drains of the transistors PB1, PB2 are electrically coupled to a node C. As a result, the transistors PB1, PB2 are electrically coupled in parallel between VDD and the node C. Sources of the transistors PA1, PA2 are electrically coupled to the node C. Drains of the transistors PA1, PA2 are electrically coupled to the output ZN. As a result, the transistors PA1, PA2 are electrically coupled in parallel between the node C and the output ZN. The parallel coupled transistors PB1, PB2 and the parallel coupled transistors PA1, PA2 are electrically coupled in series at the node C.

Sources of the transistors NA2, NB2 are electrically coupled to a second node (or rail) of a second power supply voltage. The second node (or rail) and the second power supply voltage are commonly referred to herein as VSS (or ground). A drain of the transistor NA2 is electrically coupled to a source of the transistor NA1 at a node D. As a result, the transistors NA1, NA2 are electrically coupled in series. A drain of the transistor NB2 is electrically coupled to a source of the transistor NB1 at a node E. As a result, the transistors NB1, NB2 are electrically coupled in series. Drains of the transistors NA1, NB1 are electrically coupled to the output ZN. As a result, the serially coupled transistors NA1, NA2 and the serially coupled transistors NB1, NB2 are coupled in parallel between the output ZN and VSS.

Figure 3A:
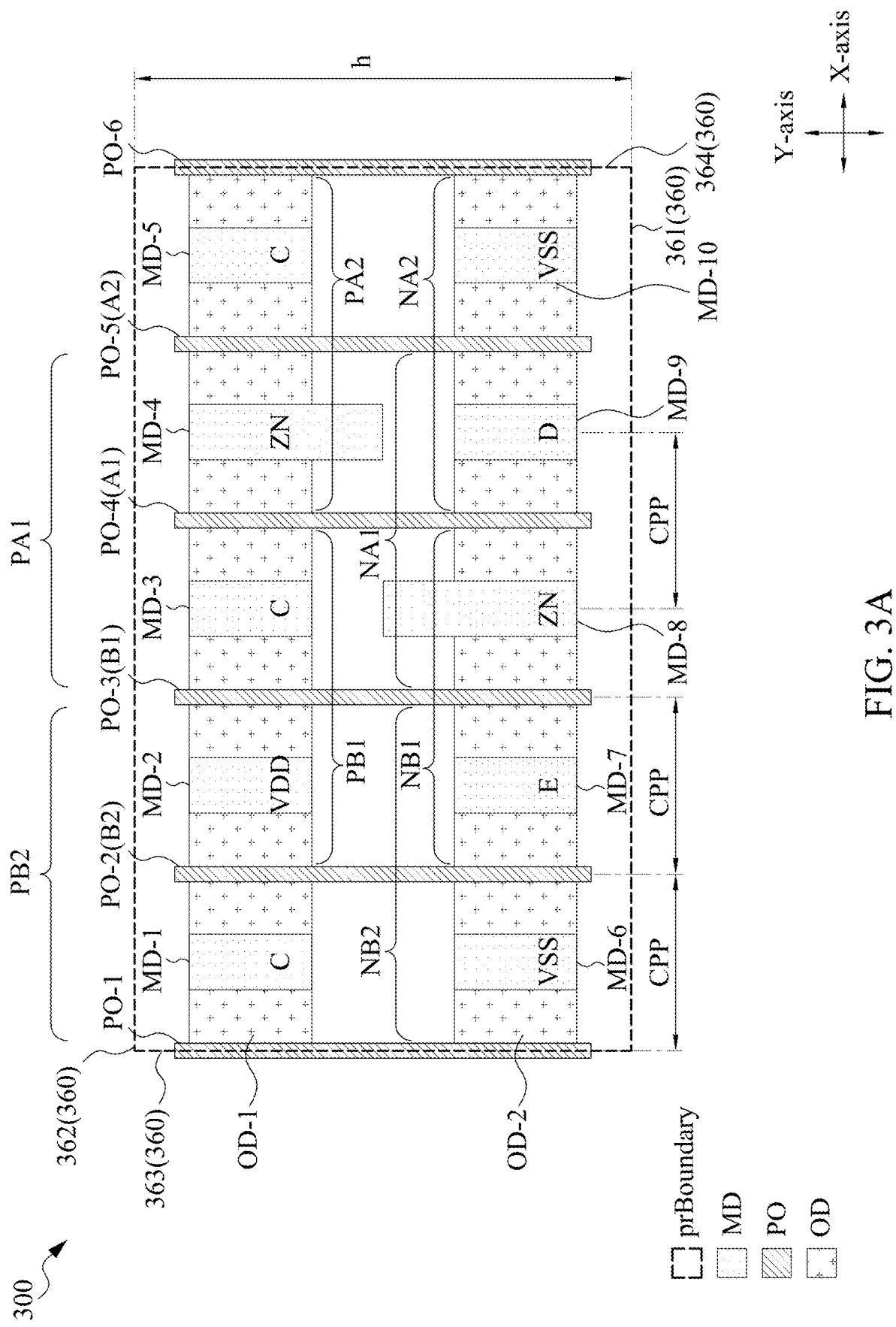
FIGS. 3A and 3B are schematic views at various layers of a layout diagram of a circuit region of an IC device, in accordance with some embodiments.
Figure 3B:
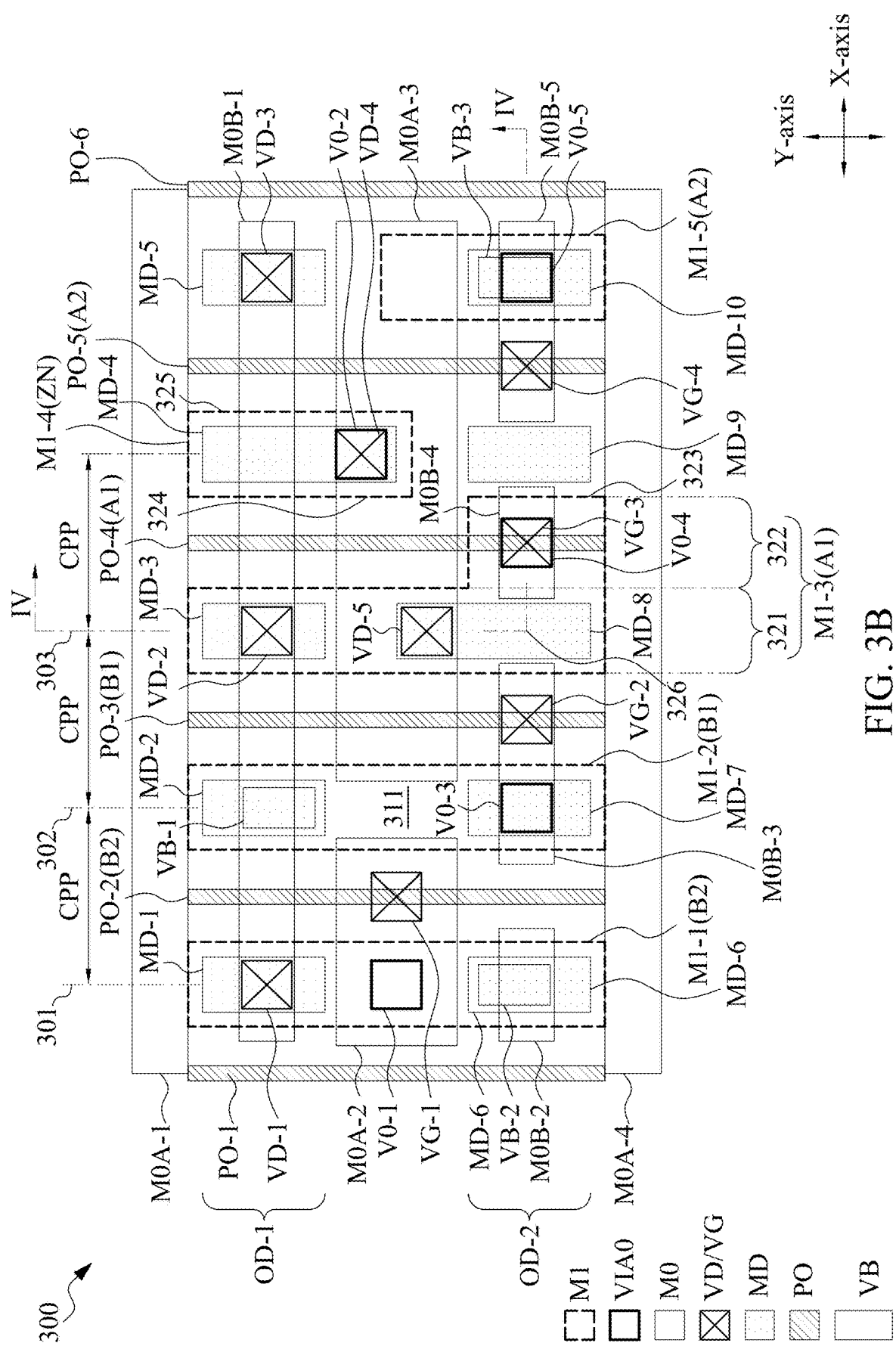

FIGS. 3A and 3B are schematic views at various layers of a layout diagram of a circuit region 300 of an IC device, in accordance with some embodiments. In at least one embodiment, the circuit region 300 corresponds to the circuit region 200. Corresponding elements of the circuit region 200 and the circuit region 300 are designated by the same reference numerals. FIG. 3A shows various layers of the circuit region 300 in an FEOL stage. FIG. 3B additionally shows several layers of the circuit region 300 in a BEOL stage. In at least one embodiment, the layout diagram of the circuit region 300 is stored as a standard cell in a standard cell library on a non-transitory computer-readable medium.

As shown in FIG. 3A, the circuit region 300 comprises a plurality of active regions OD-1, OD-2. Active regions are sometimes referred to as oxide-definition (OD) regions or source/drain regions, and are schematically illustrated in the drawings with the label "OD." In at least one embodiment, the active regions OD-1, OD-2 are over a first side, or a front side, of a substrate as described herein. The active regions OD-1, OD-2 are elongated along a first axis, e.g., the X-axis. The active regions OD-1, OD-2 include P-type dopants and/or N-type dopants to form one or more circuit elements or devices. Examples of circuit elements include, but are not limited to, transistors and diodes. Examples of transistors include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), etc.), FinFETs, planar MOS transistors with raised source/drains, nanosheet FETs, nanowire FETs, or the like. An active region configured to form one or more PMOS devices is sometimes referred to as "PMOS active region," and an active region configured to form one or more NMOS devices is sometimes referred to as "NMOS active region." In the example configuration described with respect to FIG. 3A, the active region OD-1 comprises a PMOS active region, and the active region OD-2 comprise an NMOS active region. Other configurations are within the scopes of various embodiments.

The circuit region 300 further comprises a plurality of gate regions PO-1, PO-2, PO-3, PO-4, PO-5, PO-6 over the active regions OD-1, OD-2. The gate regions PO-1, PO-2, PO-3, PO-4, PO-5, PO-6 are elongated along a second axis, e.g., the Y-axis, which is transverse to the X-axis. The gate regions PO-1, PO-2, PO-3, PO-4, PO-5, PO-6 are arranged along the X axis at a regular pitch designated at CPP (contacted poly pitch) in FIG. 3A. CPP is a center-to-center distance along the X axis between two directly adjacent gate regions. Two gate regions are considered directly adjacent where there are no other gate regions therebetween. A width (or cell pitch) of the circuit region 300 along the X axis is 5 CPP in the example configuration in FIG. 3A. The gate regions PO-1, PO-2, PO-3, PO-4, PO-5, PO-6 comprise a conductive material, such as, polysilicon, which is sometimes referred to as "poly." The gate regions PO-1, PO-2, PO-3, PO-4, PO-5, PO-6 are schematically illustrated in the drawings with the label "PO." Other conductive materials for the gate regions, such as metals, are within the scope of various embodiments. In the example configuration in FIG. 3A, the gate regions PO-2, PO-3, PO-4, PO-5 are functional gate regions which, together with the active regions OD-1, OD-2, configure a plurality of transistors as described herein. In some embodiments, the gate regions PO-1, PO-6 are non-functional, or dummy, gate regions. Dummy gate regions are not configured to form transistors together with underlying active regions, and/or one or more transistors formed by dummy gate regions together with the underlying active regions are not electrically coupled to other circuitry in the circuit region 300 and/or the IC device including the circuit region 300. In at least one embodiment, non-functional, or dummy, gate regions include dielectric material in a manufactured IC device.

The circuit region 300 further comprises a plurality of transistors configured by the gate regions PO-1, PO-2, PO-3, PO-4, PO-5, PO-6 and the active regions OD-1, OD-2. For example, the transistors PB2, PB1, PA1, PA2 are configured by the PMOS active region OD-1 together with the corresponding gate regions PO-2, PO-3, PO-4, PO-5. The transistors NB2, NB1, NA1, NA2 are configured by the NMOS active region OD-2 together with the corresponding gate regions PO-2, PO-3, PO-4, PO-5. The gate region PO-2 corresponds to the gates of the transistors PB2, NB2, and also corresponds to the input B2 of the circuit region 200. The gate region PO-3 corresponds to the gates of the transistors PB1, NB1, and also corresponds to the input B1 of the circuit region 200. The gate region PO-4 corresponds to the gates of the transistors PA1, NA1, and also corresponds to the input A1 of the circuit region 200. The gate region PO-5 corresponds to the gates of the transistors PA2, NA2, and also corresponds to the input A2 of the circuit region 200. Source/drains of the transistors PB2, PB1, PA1, PA2 correspond to portions of the active region OD-1 on opposite sides of the corresponding gate regions PO-2, PO-3, PO-4, PO-5. Source/drains of the transistors NB2, NB1, NA1, NA2 correspond to portions of the active region OD-2 on opposite sides of the corresponding gate regions PO-2, PO-3, PO-4, PO-5.

The circuit region 300 further comprises contact structures over and in electrical contact with the corresponding source/drains in the active regions OD-1, OD-2. Contact structures are sometimes referred to as metal-to-device structures, and are schematically illustrated in the drawings with the label "MD." An MD contact structure includes a conductive material formed over a corresponding source/drain in the corresponding active region to define an electrical connection from one or more devices formed in the active region to other internal circuitry of the IC or to outside circuitry. In the example configuration in FIG. 3A, contact structures MD-1, MD-2, MD-3, MD-4, MD-5 are over the active region OD-1, in electrical contact with the corresponding source/drains of the transistors PB2, PB1, PA1, PA2, and arranged alternatingly with the gate regions PO-1, PO-2, PO-3, PO-4, PO-5, PO-6 along the X-axis. A pitch, i.e., a center-to-center distance along the X axis, between directly adjacent contact structures is the same as the pitch CPP between directly adjacent gate regions. Contact structures MD-6, MD-7, MD-8, MD-9, MD-10 are over the active region OD-2, in electrical contact with the corresponding source/drains of the transistors NB2, NB1, NA1, NA2, and arranged alternatingly with the gate regions PO-1, PO-2, PO-3, PO-4, PO-5, PO-6 along the X-axis. An example conductive material of the contact structures contact structures MD-1, MD-2, MD-3, MD-4, MD-5, MD-6, MD-7, MD-8, MD-9, MD-10 includes metal. Other configurations are within the scopes of various embodiments.

In the example configuration in FIG. 3A, the contact structures MD-1, MD-3, MD-5 correspond to the node C in the circuit region 200, and are to be electrically coupled together by one or more metal layers as described herein. The contact structure MD-2 corresponds to VDD in the circuit region 200. The contact structures MD-4, MD-8 correspond to the output ZN in the circuit region 200, and are to be electrically coupled together by one or more metal layers as described herein. The contact structures MD-6, MD-10 correspond to VSS in the circuit region 200, and are to be electrically coupled together by one or more metal layers as described herein. The contact structure MD-7 corresponds to the node E in the circuit region 200. The contact structure MD-9 corresponds to the node D in the circuit region 200.

The circuit region 300 further comprises a boundary (or cell boundary) 360 which comprises edges 361, 362, 363, 364. The edges 361, 362 are elongated along the X axis, and the edges 363, 364 are elongated along the Y axis. The edges 361, 362, 363, 364 are connected together to form the closed boundary 360. In a place-and-route operation (also referred to as "automated placement and routing (APR)") described herein, cells are placed in an IC layout diagram in abutment with each other at their respective boundaries. The boundary 360 is sometimes referred to as "place-and-route boundary" and is schematically illustrated in the drawings with the label "prBoundary." The rectangular shape of the boundary 360 is an example. Other boundary shapes for various cells are within the scope of various embodiments. The edges 361, 362 coincide with centerlines of corresponding M0 conductive patterns (not shown in FIG. 3A) as described herein. The edges 363, 364 coincide with centerlines of dummy or non-functional gate regions PO-1, PO-6. Between the edges 361, 362 and along the Y axis, the circuit region 300 contains one PMOS active region, i.e., OD-1, and one NMOS active region, i.e., OD-2, and is considered to have a height corresponding to one cell height h. As described with respect to FIG. 7A, another cell or circuit region containing along the Y axis two PMOS active regions and two NMOS active regions is considered to have a height corresponding to two cell heights, or double cell height, 2h.

FIG. 3B shows further layers in the layout diagram of the circuit region 300. For simplicity, the active regions OD-1, OD-2 are schematically indicated by curly brackets (or braces) and the boundary 360 is omitted in FIG. 3B.

As shown in FIG. 3B, the circuit region 300 further comprises via structures over and in electrical contact with the corresponding gate regions or contact structures. A via structure over and in electrical contact with a contact structure is sometimes referred to as via-to-device (VD). A via structure over and in electrical contact with a gate region is sometimes referred to as via-to-gate (VG). VD and VG via structures are schematically illustrated in the drawings with the label "VD/VG." In the example configuration in FIG. 3B, via structures VD-1, VD-2, VD-3, VD-4, VD-5 are over and in electrical contact with the corresponding contact structures contact structures MD-1, MD-3, MD-5, MD-4, MD-8. Via structures VG-1, VG-2, VG-3, VG-4 are over and in electrical contact with the corresponding gate regions PO-2, PO-3, PO-4, PO-5. An example material of the VD and VG via structures includes metal. Other configurations are within the scopes of various embodiments.

The circuit region 300 further comprises at least one through via structure configured to extend through the substrate of an IC device comprising the circuit region 300 from a second side, or a back side, of the substrate. Such through via structure is configured to be in electrical contact with the back side of a corresponding source/drain in a corresponding active region, as described herein. A through via structure is sometimes referred to as a backside via structure, and is schematically illustrated in the drawings with the label "VB." In the example configuration in FIG. 3B, through via structures VB-1, VB-2, VB-3 are under and in electrical contact with the back sides of the source/drains which, in turn, are under and in electrical contact on the front sides with the corresponding contact structures MD-2, MD-6, MD-10. The through via structures are configured to electrically couple the corresponding source/drains to corresponding conductive patterns in a backside-metal-zero (BMO) layer, as described herein. In the example configuration in FIG. 3B, the through via structure VB-1 is configured to electrically couple the sources of the transistors PB1, PB2 corresponding the contact structure MD-2 to a VDD power rail on the back side of the substrate. The through via structure VB-2 is configured to electrically couple the source of the transistor NB2 corresponding the contact structure MD-6 to a VSS power rail on the back side of the substrate. The through via structure VB-3 is configured to electrically couple the source of the transistor NA2 corresponding the contact structure MD-10 to the same or a different VSS power rail on the back side of the substrate. An example material of the through via structure includes metal. Other configurations are within the scopes of various embodiments.

The circuit region 300 further comprises a plurality of metal layers and via layers sequentially and alternatingly arranged over the VD and VG via structures. The lowermost metal layer immediately over and in electrical contact with the VD and VG via structures is the M0 layer, i.e., metal-zero (M0) layer, a next metal layer immediately over the M0 layer is the M1 layer, a next metal layer immediately over the M1 layer is the M2 layer, or the like. A via layer VIAn is arranged between and electrically couple the Mn layer and the Mn+1 layer, where n is an integer form zero and up. For example, a via-zero (VIA0 or V0) layer is the lowermost via layer which is arranged between and electrically couple the M0 layer and the M1 layer. Other via layers are VIA1 (or V1), VIA2 (or V2), or the like. For simplicity, the M0 layer, VIA0 layer and M1 layer are illustrated in FIG. 3B, and other metal layers and/or via layers are omitted.

The M0 layer is the lowermost metal layer over, or the closest metal layer to, the active regions OD-1, OD-2, on the front side of the substrate, as described herein. In some embodiments, all conductive patterns in the M0 layer belong to the same mask. In at least one embodiment, the conductive patterns in the M0 layer are separated into several masks to meet one or more design and/or manufacturing requirements. For example, in FIG. 3B, the conductive patterns in the M0 layer comprise conductive patterns M0A-1, M0A-2, M0A-3, M0A-4 corresponding to one mask, and conductive patterns M0B-1, M0B-2, M0B-3, M0B-4, M0B-5 corresponding to another mask. The MOA conductive patterns and M0B conductive patterns are arranged alternatingly along the Y-axis. For example, the conductive pattern M0B-1 is arranged between the conductive pattern M0A-1 on one side and the conductive patterns M0A-2, M0A-3 on the other side. The conductive patterns M0A-2, M0A-3 are arranged between the conductive pattern M0B-1 on one side and the conductive patterns M0B-2, M0B-3, M0B-4, M0B-5 on the other side. The conductive patterns M0B-2, M0B-3, M0B-4, M0B-5 are arranged between the conductive patterns M0A-2, M0A-3 on one side and the conductive pattern M0A-4 on the other side. The edges 361, 362 of the boundary 360 correspondingly coincide with centerlines of the conductive patterns M0A-1, M0A-4.

In FIG. 3B, the conductive patterns M0A-2, M0A-3 are arranged in the same row along the X axis, and are separated by a space 311. This is an example way for showing that the conductive patterns M0A-2, M0A-3 are disconnected from each other, and reflects a physical arrangement of the conductive patterns M0A-2, M0A-3 in an actual IC device manufactured in accordance with the layout diagram in FIG. 3B. Another way for showing that the conductive patterns M0A-2, M0A-3 are disconnected from each other includes showing the conductive patterns M0A-2, M0A-3 as a continuous conductive pattern, but with an additional cut-MOA region (not shown) of a cut-MOA mask over the space 311. Such a cut-MOA mask indicates areas where MOA conductive patterns are not to be formed. Similarly, in FIG. 3B, conductive patterns M0B-2, M0B-3, M0B-4, M0B-5 are arranged in the same row along the X axis, and are separated by various spaces (not numbered) between the adjacent conductive patterns M0B-2, M0B-3, M0B-4, M0B-5. Another way of indicating that the conductive patterns M0B-2, M0B-3, M0B-4, M0B-5 are disconnected from each other includes showing the conductive patterns M0B-2, M0B-3, M0B-4, M0B-5 as a continuous conductive pattern, but with additional cut-M0B regions (not shown) of a cut-M0B mask over the corresponding spaces between the adjacent conductive patterns M0B-2, M0B-3, M0B-4, M0B-5. Such a cut-M0B mask indicates areas where M0B conductive patterns are not to be formed.

The conductive pattern M0B-1 is over and in electrical contact with the via structures VD-1, VD-2, VD-3, and electrically couples together the contact structures MD-1, MD-3, MD-5 corresponding the node C of the circuit region 200. The conductive pattern M0A-2 is over and in electrical contact with the via structure VG-1, and is electrically coupled to the gate region PO-2. The conductive pattern M0A-3 is over and in electrical contact with the via structures VD-4, VD-5, and electrically couples together the contact structures MD-4, MD-8 corresponding the output ZN of the circuit region 200. The conductive pattern M0B-2 is over but is not in electrical contact with the underlying contact structure MD-6. In at least one embodiment, the conductive pattern M0B-2 is provided to satisfy one or more design rules. In at least one embodiment, the conductive pattern M0B-2 is omitted or is continuous with the conductive pattern M0B-3. The conductive pattern M0B-3 is over and in electrical contact with the via structure VG-2, and is electrically coupled to the gate region PO-3. The conductive pattern M0B-4 is over and in electrical contact with the via structure VG-3, and is electrically coupled to the gate region PO-4. The conductive pattern M0B-5 is over and in electrical contact with the via structure VG-4, and is electrically coupled to the gate region PO-5. The conductive pattern M0B-5 is also over but is not in electrical contact with the underlying contact structure MD-10. The conductive patterns M0A-1, M0A-4 are not electrically coupled to the other elements in the circuit region 300, and are provided to satisfy one or more design rules, in one or more embodiments.

In the example configuration in FIG. 3B, all of the conductive patterns of the M0 layer in the circuit region 300 are elongated along the X axis. In other words, each of the conductive patterns of the M0 layer in the circuit region 300 is a 1D conductive pattern that has a dimension along the X axis greater than a dimension along the Y axis. In some embodiments, all of the conductive patterns of the M0 layer, not only in the circuit region 300 but also in other circuit regions of the IC device, are 1D conductive patterns elongated along the X axis. In at least one embodiment, the shapes of the conductive patterns of the M0 layer are rectangles.

The circuit region 300 further comprises, in the VIA0 layer over the M0 layer, via structures V0-1, V0-2, V0-3, V0-4, V0-5 over and in electrical contact with the corresponding conductive patterns M0A-2, M0A-3, M0B-3, M0B-4, M0B-5 of the M0 layer. In the example configuration in FIG. 3B, the via structures V0-2, V0-4 correspondingly overlap the via structures VD-4, VG-3. Other configurations are within the scopes of various embodiments.

The circuit region 300 further comprises, in the M1 layer over the VIA0 layer, conductive patterns M1-1, M1-2, M1-3, M1-4, M1-5. The M1 layer is an example of an upper metal layer, the M0 layer is an example of a lower metal layer, conductive patterns in the M1 layer are examples of upper conductive patterns, and conductive patterns in the M0 layer are examples of lower conductive patterns. The upper conductive patterns comprise at least one input or output to electrically couple the circuit region to external circuitry outside the circuit region, and at least one of the upper conductive patterns is a 2D conductive pattern. In the example configuration in FIG. 3B, the upper conductive patterns M1-1, M1-2, M1-3, M1-5, M1-4 correspondingly include inputs B2, B1, A1, A2 and output ZN of the circuit region 300, and the upper conductive pattern M1-3 is a 2D conductive pattern, as described herein. Other configurations are within the scopes of various embodiments. For example, in some embodiments, a circuit region comprises at least one input or output in an upper metal layer other than the M1 layer, e.g., in the M2 layer, or the M3 layer, or a higher metal layer, and at least one upper conductive pattern in the M2, M3, or higher metal layer is a 2D conductive pattern.

The conductive pattern M1-1 is over and in electrical contact with the via structure V0-1. As a result, the gate region PO-2 is electrically coupled to the conductive pattern M1-1, through the via structure VG-1, the conductive pattern M0A-2 and the via structure V0-1, to receive an input signal corresponding to the input B2. The conductive pattern M1-2 is over and in electrical contact with the via structure V0-3. As a result, the gate region PO-3 is electrically coupled to the conductive pattern M1-2, through the via structure VG-2, the conductive pattern M0B-3 and the via structure V0-3, to receive an input signal corresponding to the input B1. The conductive pattern M1-3 is over and in electrical contact with the via structure V0-4. As a result, the gate region PO-4 is electrically coupled to the conductive pattern M1-3, through the via structure VG-3, the conductive pattern M0B-4 and the via structure V0-4, to receive an input signal corresponding to the input A1. The conductive pattern M1-4 is over and in electrical contact with the via structure V0-2. As a result, the contact structures MD-4, MD-8 are electrically coupled to conductive pattern M1-4, through the corresponding via structures VD-4, VD-5, the conductive pattern M0A-3 and the via structure V0-2, to output an output signal corresponding to the output ZN. The conductive pattern M1-5 is over and in electrical contact with the via structure V0-5. As a result, the gate region PO-5 is electrically coupled to the conductive pattern M1-5, through the via structure VG-4, the conductive pattern M0B-5 and the via structure V0-5, to receive an input signal corresponding to the input A2. The conductive patterns M1-1, M1-2, M1-3, M1-5, M1-4 provide pin-outs corresponding to the inputs B2, B1, A1, A2 and the output ZN for electrical connections of the circuit region 300 to the other circuitry of the IC device or to external circuitry.

In the example configuration in FIG. 3B, the conductive patterns M1-1, M1-2, M1-4, M1-5 are 1D conductive pattern which are elongated along the Y axis. In at least one embodiment, the shapes of the 1D conductive patterns in the M1 layer are rectangles. The conductive pattern M1-3 is a 2D conductive pattern which extends along both the X axis and the Y axis.

Specifically, the conductive pattern M1-3 has an L-shape and comprises a first section 321 and a second section 322 contiguous to the first section 321. The first section 321 is a rectangle extending over an entire dimension or length of the conductive pattern M1-3 along the Y axis. The first section 321 is considered as a 1D conductive pattern similarly to the 1D conductive patterns M1-1, M1-2, M1-4, M1-5. For example, the 1D conductive patterns M1-1, M1-2, the first section 321, and the 1D conductive patterns M1-4, M1-5 are arranged at the same pitch along the X axis. The pitch is a center-to-center distance along the X axis between two directly adjacent conductive patterns in the M1 layer. In the M1 layer, two conductive patterns are considered directly adjacent where there are no other conductive patterns therebetween. In some embodiments, the first section 321 and the 1D conductive patterns M1-1, M1-2, M1-4, M1-5 have the same width along the X axis. In the example configuration in FIG. 3B, the first section 321 is over several conductive patterns of the M0 layer, such as the conductive patterns M0A-3, M0B-1. However, the VIA0 layer comprises no V0 via structures between the first section 321 and the underlying conductive patterns M0A-3, M0B-1.

While the first section 321 is considered as a 1D conductive pattern elongated along the Y axis, the second section 322 is considered as a lateral conductive pattern contiguous with and projecting, along the X axis, from the 1D conductive pattern or first section 321. The second section 322 is over the conductive pattern M0B-4 and is electrically coupled to the underlying conductive pattern M0B-4 by the via structure V0-4. In the example configuration in FIG. 3B, the second section 322 has an edge 323 aligned, along the Y axis, with an edge 324 of the conductive pattern M1-4. The edge 323 is elongated along the Y axis and is the furthest part of the second section 322 from the first section 321. The edge 324 is elongated along the Y axis and is the closest part of the conductive pattern M1-4 to the first section 321 which is directly adjacent to the conductive pattern M1-4. The described configuration of the edge 323 of the second section 322 being aligned, along the Y axis, with the edge 324 of the conductive pattern M1-4 is an example. Other configurations are within the scopes of various embodiments. For example, in one or more embodiments, the edge 323 of the second section 322 is aligned along the Y axis with an opposite edge 325 of the conductive pattern M1-4, as described with respect to FIG. 5. In at least one embodiment, the edge 323 of the second section 322 is arranged, along the X axis, between the edges 324, 325 of the conductive pattern M1-4, as described with respect to FIG. 3C. In one or more embodiments, the second section 322 projects along the X axis beyond the edge 325 of the conductive pattern M1-4, provided that a design rule regarding a minimal distance between directly adjacent M1 conductive patterns along the X axis is satisfied. In the described example configurations, the second section 322 overlaps, wholly or partly, the conductive pattern M1-4 along the Y axis. In one or more embodiments, the second section 322 projects along the X axis toward the conductive pattern M1-4, but does not overlap the conductive pattern M0B-4 along the Y axis, i.e., in FIG. 3B, the edge 323 is arranged on the left of the edge 324 along the X axis.

In some embodiments, along the Y axis, a centerline of each 1D conductive pattern of the M1 layer coincides, or is aligned with, a centerline of an underlying MD contact structure. For example, the centerline 301 of the conductive pattern M1-1 along the Y axis coincides, or is aligned with, a centerline of the MD contact structures MD-1, MD-6 along the Y axis. The centerline 302 of the conductive pattern M1-2 along the Y axis coincides, or is aligned with, a centerline of the MD contact structures MD-2, MD-7 along the Y axis. The centerline 303 of the first section 321 of the conductive pattern M1-3 along the Y axis coincides, or is aligned with, a centerline of the MD contact structures MD-3, MD-8 along the Y axis. Because directly adjacent MD contact structures are arranged along the X axis at the same pitch CPP as the pitch between directly adjacent gate regions, the pitch along the X axis between directly adjacent M1 conductive patterns is also CPP.

Figure 3C:
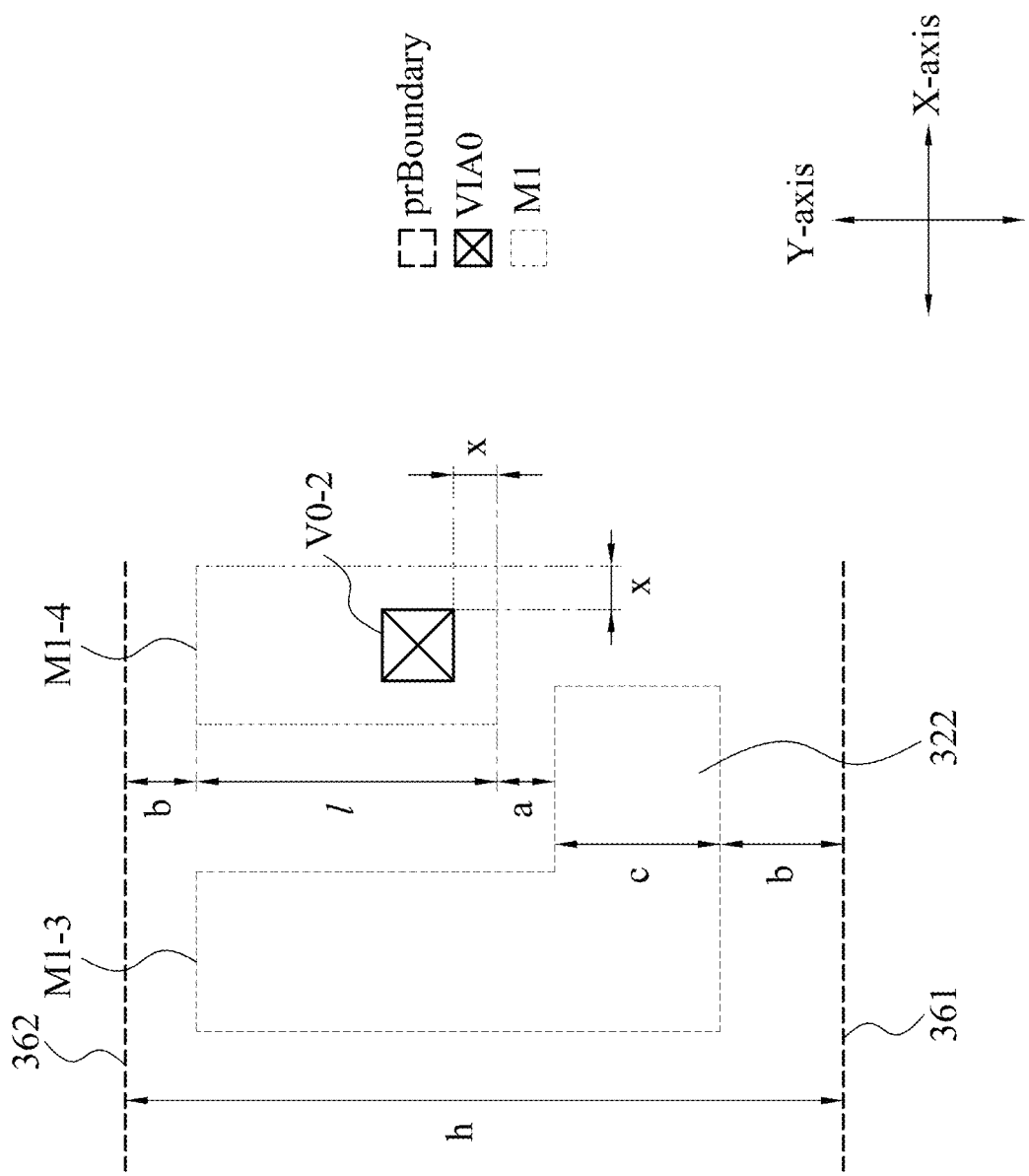
FIG. 3C is an enlarged schematic view of a portion of a layout diagram of a circuit region of an IC device, in accordance with some embodiments.

FIG. 3C is an enlarged schematic view of a portion containing the conductive patterns M1-3, M1-4 in FIG. 3B. FIG. 3C shows an alternative arrangement where the conductive pattern M1-3 overlap, along the Y axis, a part of a width of the conductive pattern M1-4.

In FIG. 3C, a plurality of design rules related to conductive patterns in the M1 layer and via structures in the underlying VIA0 layer are described. As described herein, h is one cell height. In the 2D conductive pattern M1-3, a minimal width of the lateral conductive pattern 322 along the Y axis is c. A minimal distance along the Y axis between adjacent M1 conductive pattern, e.g., M1-4 and 322, is a. A minimal distance along the Y axis from each M1 conductive pattern, e.g., M1-3, M1-4, to the closest edge, e.g., 361, 362 of the cell boundary is b. A minimal length of each M1 conductive pattern, e.g., M1-4, along the Y axis is l. A minimal distance along either the X axis or Y axis from a V0 via structure, e.g., V0-2, to the closest edge of the overlying M1 conductive pattern, e.g., M1-4, also referred to herein as "metal enclosure," is x. In some embodiments, h is 50 nm~300 nm, c≥1 nm, b≥1 nm, a≥1 nm, l≥1 nm, and x is 0 nm~50 nm. These specific design rules are examples. Other design rules are within the scopes of various embodiments.

In some embodiments, by using the 2D conductive pattern M1-3, it is possible to provide routing to various transistors in the circuit region 300, while keeping the cell pitch (or width along the X axis) of the circuit region 300 at a desired low value of 5 CPP. As a result, it is possible, in one or more embodiments, to reduce the area and/or increase the gate density of the circuit region 300. Such advantages are significant design considerations at advanced manufacturing nodes where the design rules are strict and/or dimensions of various features are minimized extensively. The described advantages in accordance with some embodiments may not be achievable in other approaches that do not use 2D conductive patterns, especially at advanced manufacturing nodes.

Figure 4:
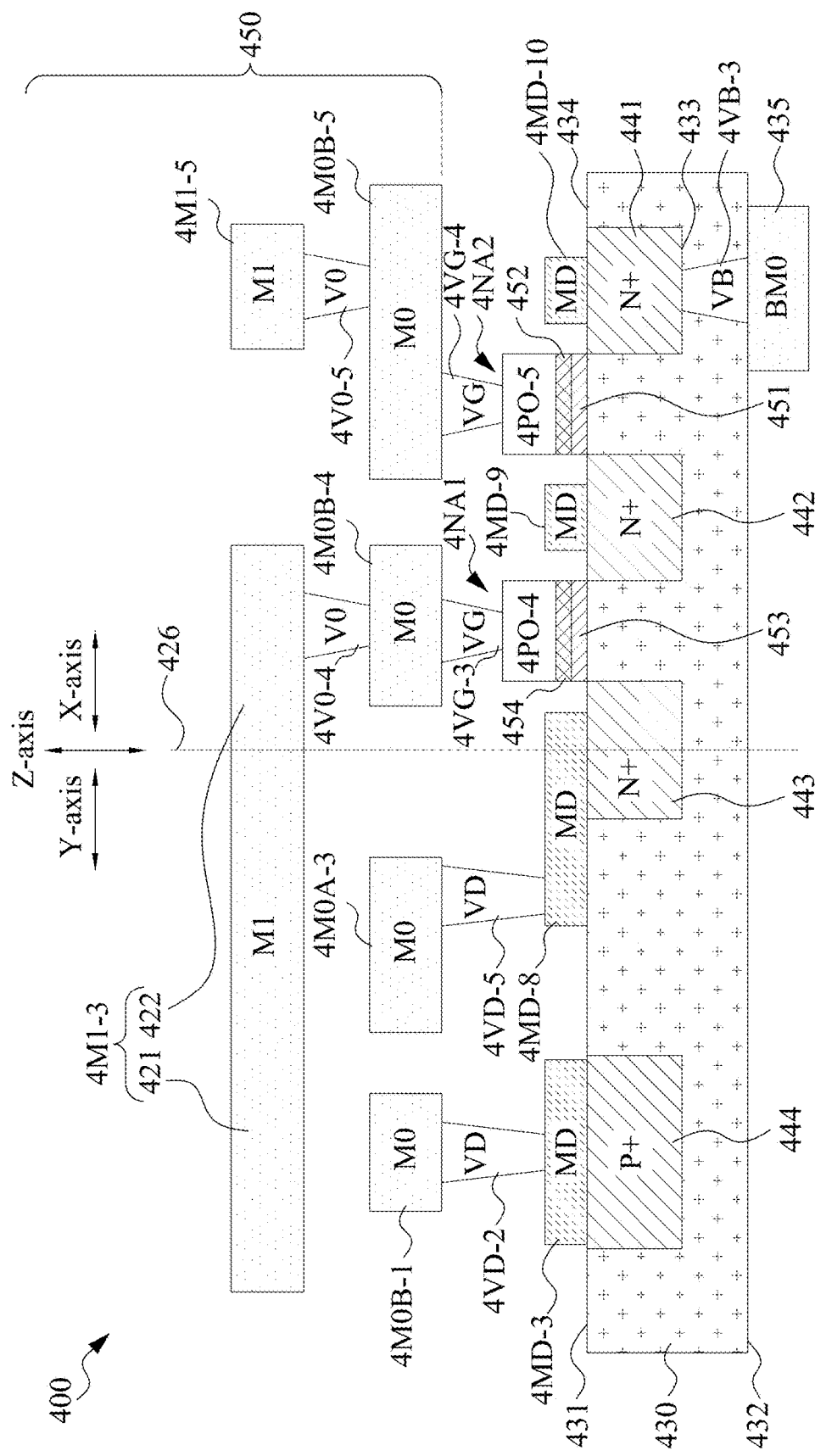
FIG. 4 is a schematic cross-sectional view, taken along line IV-IV in FIG. 3B, of an IC device, in accordance with some embodiments.

FIG. 4 is a schematic cross-sectional view, taken along line IV-IV in FIG. 3B, of an IC device 400, in accordance with some embodiments. The IC device 400 comprises a circuit region corresponding to the circuit region 300 described with respect to FIGS. 3A-3C. The cross-section line IV-IV in FIG. 3B extends along the longitudinal center line of the conductive patterns M0B-4, M0B-5, and then along the longitudinal center line of the first section 321 of the conductive pattern M1-3. A corner 326 between the longitudinal center line of the conductive patterns M0B-4, M0B-5 and the longitudinal center line of the first section 321 corresponds to a line 426 in FIG. 4. The part of FIG. 4 on the right side of the line 426 corresponds to the cross-sectional view along the longitudinal center line of the conductive patterns M0B-4, M0B-5 and the X axis. The part of FIG. 4 on the left side of the line 426 corresponds to the cross-sectional view along the longitudinal center line of the first section 321 of the conductive pattern M1-3 and the Y axis. Components in FIG. 4 having corresponding components in FIGS. 3A-3C are designated by the reference numerals of FIGS. 3A-3C with a prefix "4," or by the reference numerals of FIGS. 3A-3C increased by 100. For example, the conductive pattern M1-3 in FIG. 3B corresponds to a conductive pattern 4M1-3 in FIG. 4. The first section 321 of the conductive pattern M1-3 in FIG. 3B corresponds to a first section 421 of the conductive pattern 4M1-3 in FIG. 4, on the left side of the line 426. The second section 322 of the conductive pattern M1-3 in FIG. 3B corresponds to a second section 422 of the conductive pattern 4M1-3 in FIG. 4, on the right side of the line 426.

As shown in FIG. 4, the IC device 400 comprises a substrate 430 over which the circuit region corresponding to the circuit region 300 is formed. In at least one embodiment, the substrate 430 corresponds to the substrate 102. The substrate 430 has a first side 431 and a second side 432 opposite one another along a thickness direction of the substrate 430, i.e., along a Z axis. In at least one embodiment, the first side 431 is referred to as "upper side" or "front side" or "device side," whereas the second side 432 is referred to as "lower side" or "back side."

N-type and P-type dopants are added to the front side 431 of the substrate 430 to correspondingly form N wells 441, 442, 443 in an NMOS active region corresponding to the active region OD-2, and a P well 444 in a PMOS active region corresponding to the active region OD-1. In some embodiments, isolation structures are formed between adjacent P wells and N wells. For simplicity, isolation structures are omitted from FIG. 4. The N wells 441, 442 define source/drains of a transistor 4NA2. The N wells 442, 443 define source/drains of a transistor 4NA1. The P well 444 defines a source/drain of another transistor (not shown). A gate of the transistor 4NA2 comprises a stack of gate dielectric layers 451, 452, and a gate electrode 4PO-5. A gate of the transistor 4NA1 comprises a stack of gate dielectric layers 453, 454, and a gate electrode 4PO-4. In at least one embodiment, each of the transistors 4NA1, 4NA2 comprises a gate dielectric layer instead of multiple gate dielectrics. Example materials of the gate dielectric layer or layers include HfO2, ZrO2, or the like. Example materials of the gate electrodes 4PO-4, 4PO-5 include polysilicon, metal, or the like.

The IC device 400 further comprises contact structures for electrically coupling the source/drains of the transistors to other circuit elements in the circuitry of the IC device 400. The contact structures comprise MD contact structures 4MD-3, 4MD-8, 4 MD-9, 4MD-10 correspondingly over and in electrical contact with the P well 444, and the N wells 443, 442, 441. Further, via structures 4VD-2, 4VD-5, 4VG-3, 4VG-4 are correspondingly over and in electrical contact with the MD contact structures 4MD-3, 4MD-8, and the gate electrodes 4PO-4, 4PO-5.

The IC device 400 further comprises an interconnect structure 450 which is over the VD and VG via structures, and comprises a plurality of metal layers M0, M1, . . . and a plurality of via layers V0, V1, . . . arranged alternatingly in the thickness direction of the substrate 430, i.e., along the Z axis. The interconnect structure 450 further comprises various interlayer dielectric (ILD) layers (not shown) in which the metal layers and via layers are embedded. The metal layers and via layers of the interconnect structure 450 are configured to electrically couple various elements or circuits of the IC device 400 with each other, and with external circuitry. For simplicity, metal layers and via layers above the M1 layer are omitted in FIG. 4. The M0 layer comprises conductive patterns 4M0B-1, 4M0A-3, 4M0B-4, 4M0B-5 correspondingly over and in electrical contact with the via structures 4VD-2, 4VD-5, 4VG-3, 4VG-4. The VIA0 layer comprises via structures 4V0-4, 4V0-5 correspondingly over and in electrical contact with the conductive patterns 4M0B-4, 4M0B-5 in the M0 layer. The M1 layer comprises conductive patterns 4M1-3, 4M1-5 correspondingly over and in electrical contact with the via structures 4V0-4, 4V0-5. The conductive pattern 4M1-3 is a 2D conductive pattern which comprises a first section 421 elongated along the Y axis, and a second section 422 contiguous to and projecting from the first section 421 along the X axis. Other conductive patterns in the M0 layer and the M1 layer are 1D conductive patterns elongated correspondingly along the X axis and the Y axis.

The IC device 400 further comprises a through via structure 4VB-3 extending from the back side 432 of the substrate 430 towards the N well 441, which is a source/drain of the transistor 4NA2, to be in electrical contact with a back side 433 of the N well 441. A front side 434 of the N well 441 is in electrical contact with the contact structure 4MD-10.

The IC device 400 further comprises a backside-metal-zero (BMO) layer under the back side 432 of the substrate 430. On the back side 432 of the substrate 430, the BMO layer is the uppermost metal layer under, or the closest metal layer to, the active regions or source/drains of the transistors of the IC device 400. In the example configuration in FIG. 4, the BMO layer comprises a conductive pattern 435 under and in electrical contact with the through via structure 4VB-3. The conductive pattern 435 is configured as a VSS power rail. Other conductive patterns (not shown) of the BMO layer are configured to as VDD or VSS power rails for delivery of power supply voltages to the circuitry of the IC device 400. In at least one embodiment, the IC device 400 comprises one or more further via layers, dielectric layers and metal layers (not shown) under the BMO layer to form interconnections among circuit elements of the IC device 400 and/or to form electrical connections to external circuitry. Via layers and metal layers from the BMO layer and below are sometimes referred to as backside via layers and backside metal layers. For simplicity, dielectric layers, and backside via and metal layers lower than the BMO layer 480 are omitted from FIG. 4.

Figure 5:
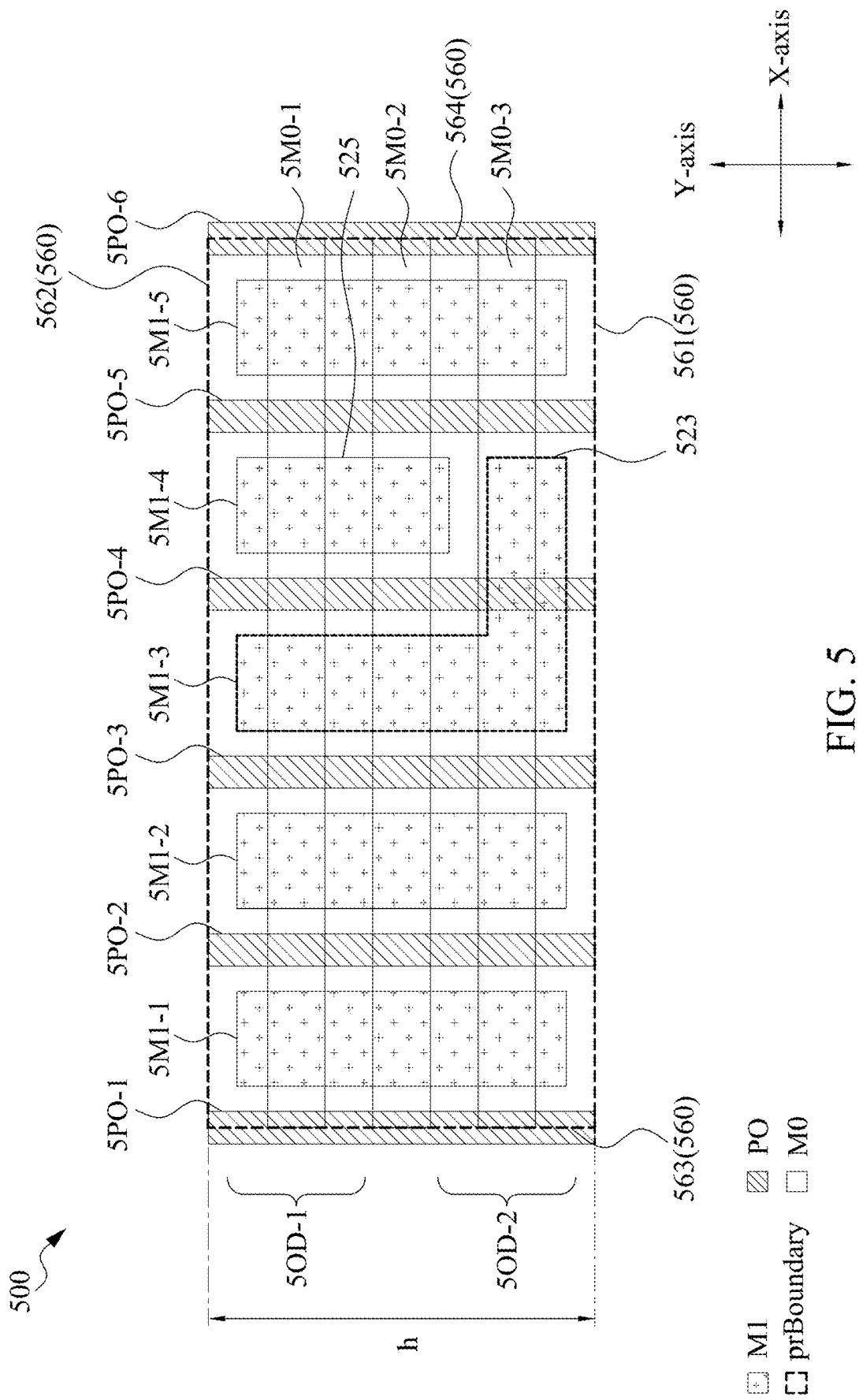
FIG. 5 is a simplified schematic view of a layout diagram of a circuit region of an IC device, in accordance with some embodiments.

FIG. 5 is a simplified schematic view of a layout diagram of a circuit region 500 of an IC device, in accordance with some embodiments. In at least one embodiment, the circuit region 500 corresponds to the circuit region 300, and FIG. 5 is a simplified view of FIG. 3B. In some embodiments, FIG. 5 is a simplified schematic view of a layout diagram of a standard cell, such as an AOI22D1 cell, stored in a standard cell library on a non-transitory computer-readable medium. Components in FIG. 5 having corresponding components in FIGS. 3A-3C are designated by the reference numerals of FIGS. 3A-3C with a prefix "5," or by the reference numerals of FIGS. 3A-3C increased by 200.

The circuit region 500 comprises a boundary 560 which comprises edges 561, 562, 563, 564. The edges 561, 562 are elongated along the X axis, and the edges 563, 564 are elongated along the Y axis. The edges 561, 562, 563, 564 are connected together to form the closed boundary 560 which is a place-and-route boundary as described herein. The circuit region 500 further comprises, in the boundary 560, active regions 5OD-1, 5OD-2, gate regions 5PO-2, 5PO-3, 5PO-4, 5PO-5, M0 conductive patterns 5M0-1, 5M0-2, 5M0-3, and M1 conductive patterns 5M1-1, 5M1-2, 5M1-3, 5M1-4, 5M1-5. Dummy or non-functional gate regions 5PO-1, 5PO-6, are arranged along the corresponding edges 563, 564 of the boundary 560. The edge 562 is along a centerline of an M0 conductive pattern (not shown) which corresponds to the conductive pattern M0A-1. The edge 561 is along a centerline of a further M0 conductive pattern (not shown) which corresponds to the conductive pattern M0A-4. Between the edges 561, 562 and along the Y axis, the circuit region 500 contains one PMOS active region, i.e., 5OD-1, and one NMOS active region, i.e., 5OD-2, and is considered to have a height corresponding to one cell height h.

Compared to the layout diagram of the circuit region 300 in FIGS. 3A-3B, the layout diagram of the circuit region 500 in FIG. 5 is simplified in that MD contact structures and various via structures are omitted. Further, one or more of the M0 conductive patterns 5M0-1, 5M0-2, 5M0-3 are simplified representations of corresponding M0 conductive patterns in FIGS. 3A-3B. For example, the conductive pattern 5M0-2 is a simplified representation of the corresponding conductive patterns M0A-2, M0A-3, and does not show that the conductive patterns M0A-2, M0A-3 are disconnected by the space 311, or by a cut-MOA mask. For another example, the conductive pattern 5M0-3 is a simplified representation of the corresponding conductive patterns M0B-2, M0B-3, M0B-4, M0B-5, and does not show that the conductive patterns M0B-2, M0B-3, M0B-4, M0B-5 are disconnected from each other. One or more of the M1 conductive patterns 5M1-1, 5M1-2, 5M1-3, 5M1-4, 5M1-5 are simplified representations of corresponding M1 conductive patterns in FIGS. 3A-3B. For example, conductive pattern 5M1-5 is a simplified representation of the corresponding conductive pattern M1-5, and does not necessarily reflect the actual length of the conductive pattern M1-5 along the Y axis. The conductive pattern 5M1-3 is a 2D conductive pattern, and the other M0 and M1 conductive patterns in the circuit region 500 are 1D conductive patterns. In the example configuration in FIG. 5, the conductive pattern 5M1-3 has an edge 523 aligned along the Y axis with an edge 525 of the conductive pattern 5M1-4. In other words, the conductive pattern 5M1-3 overlap, along the Y axis, the whole width of the conductive pattern 5M1-4. Other arrangements of the edge 523 relative to the edge 525 are within the scopes of various embodiments, as described herein.

Figure 6:
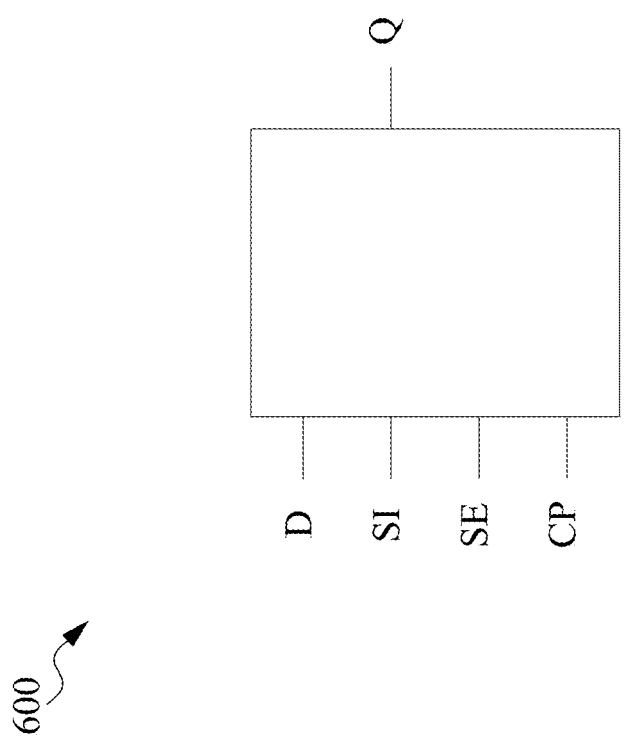
FIG. 6 is a block diagram of a circuit of an IC device, in accordance with some embodiments.

FIG. 6 is a block diagram of a circuit 600 of an IC device, in accordance with some embodiments. In at least one embodiment, the circuit 600 corresponds to a portion of the region 104 in FIG. 1. In the example configuration in FIG. 6, the circuit 600 comprises a scan D-flip-flop corresponding to a standard cell sometimes referred to as an SDFQD1 cell.

The circuit 600 comprises a data input D, a scan-in input SI, a scan-enable input SE, a clock input CP, and an output Q. In some embodiments, the circuit 600 is configured to selectively perform one or more tests on other circuitry. For example, in response to a first logic value at the scan-enable input SE, the circuit 600 is placed into a test mode, and data from the scan-in input SI are output at the output Q in accordance with a clock signal at the clock input CP. In response to a different, second logic value at the scan-enable input SE, the circuit 600 is placed into a functional mode, and data from the input D are output at the output Q in accordance with the clock signal at the clock input CP.

Figure 7A:
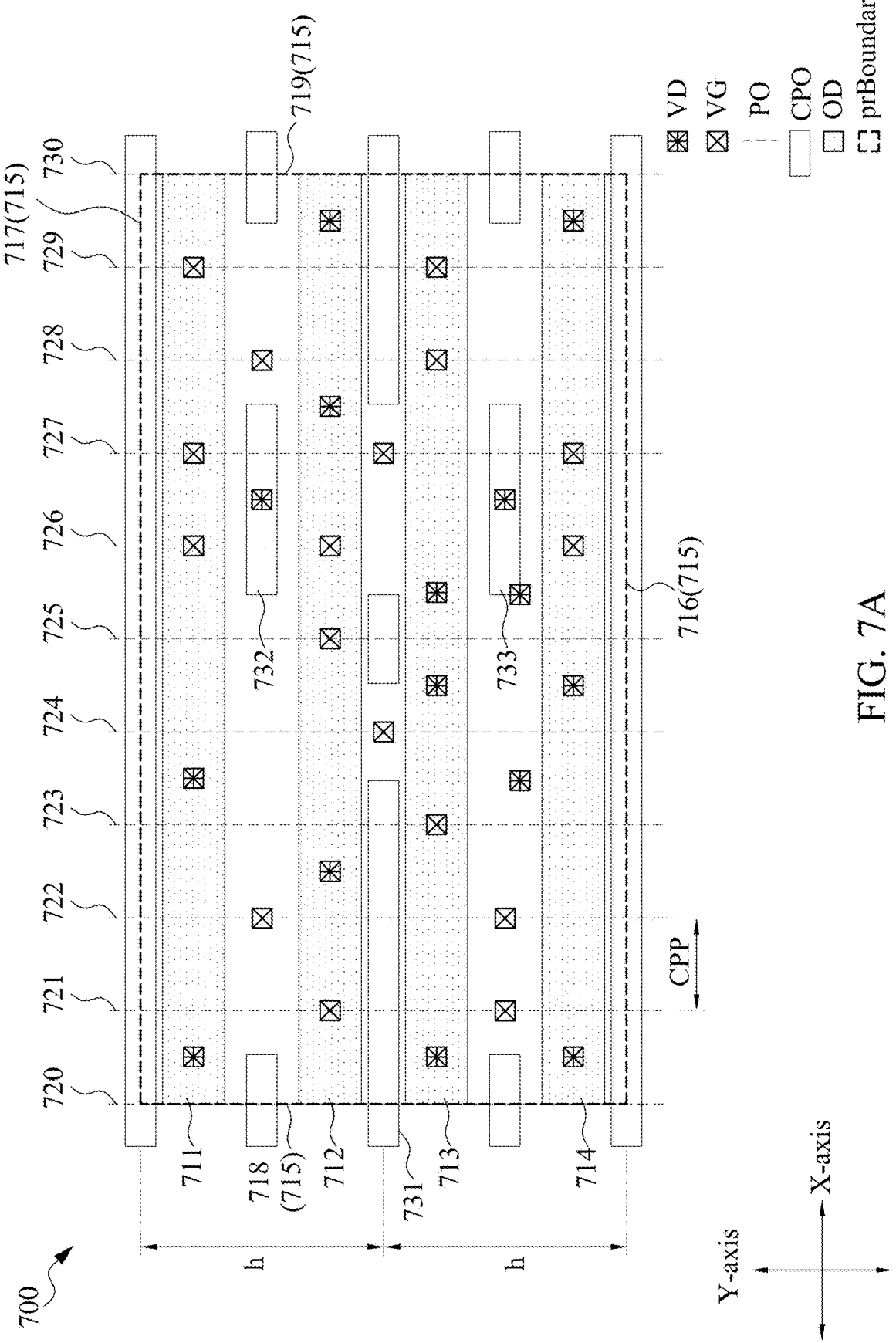
FIGS. 7A and 7B are schematic views at various layers of a layout diagram of a circuit region of an IC device, in accordance with some embodiments.
Figure 7B:
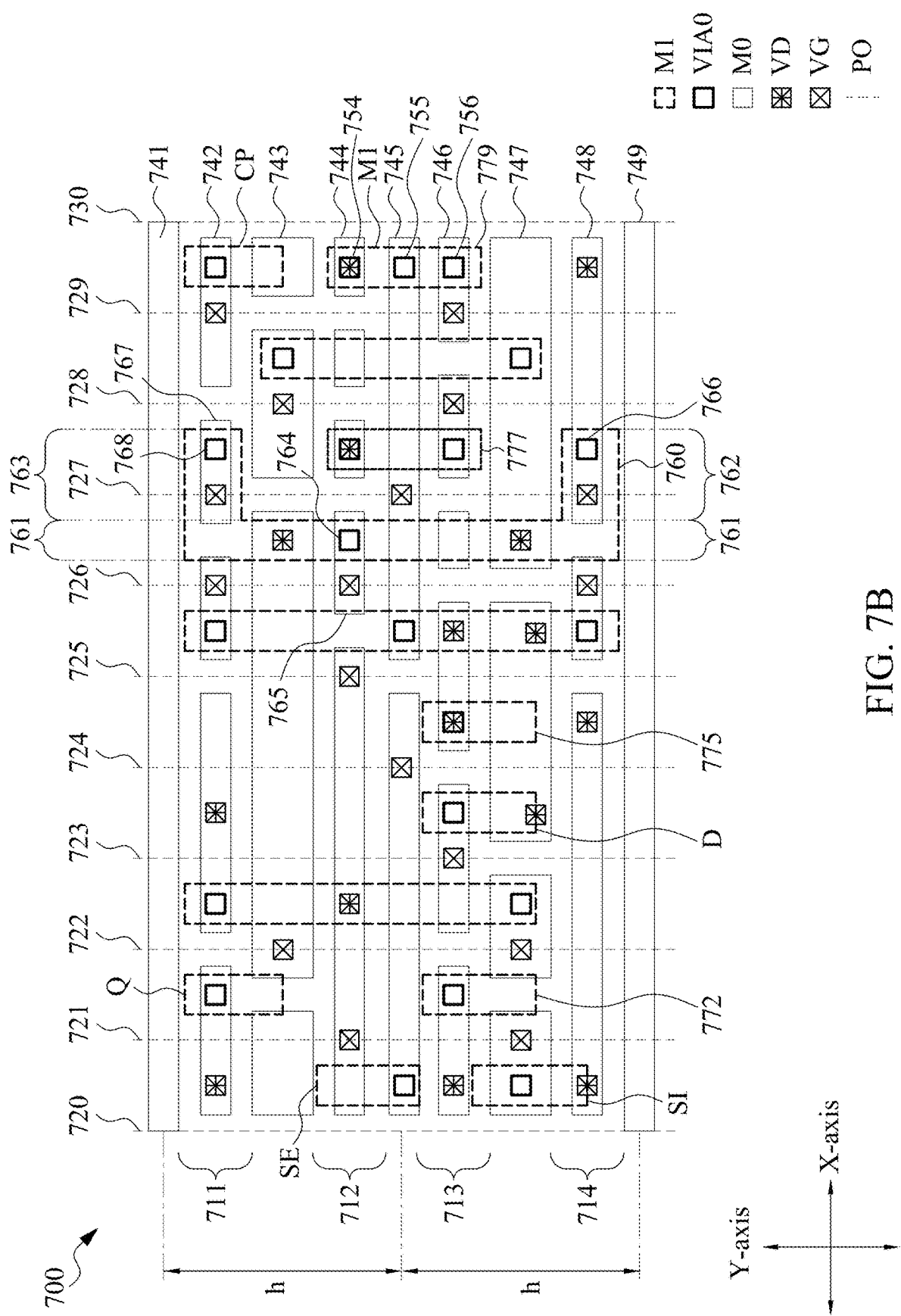

FIGS. 7A and 7B are schematic views at various layers of a layout diagram of a circuit region 700 of an IC device, in accordance with some embodiments. In at least one embodiment, the circuit region 700 corresponds to the circuit 600. Corresponding elements of the circuit 600 and the circuit region 700 are designated by the same reference numerals. FIG. 7A shows various layers of the circuit region 700 in an FEOL stage. FIG. 7B additionally shows several layers of the circuit region 700 in a BEOL stage. In at least one embodiment, the layout diagram of the circuit region 700 is stored as a standard cell in a standard cell library on a non-transitory computer-readable medium.

As shown in FIG. 7A, the circuit region 700 comprises active regions 711-714 elongated along the X axis. In at least one embodiment, the active regions 711, 713 are PMOS active regions corresponding to the active region OD-1, and the active regions 712, 714 are NMOS active regions corresponding to the active region OD-2. Because the circuit region 700 comprises two PMOS active regions and two NMOS active regions along the Y axis, the circuit region 700 has a double cell height of 2h.

The circuit region 700 further comprises gate regions 720-730 elongated along the Y axis. For simplicity, the gate regions are schematically illustrated in FIG. 7A and FIG. 7B by the corresponding center lines, also referred to as "gate tracks." The gate regions 721-729 are functional gate regions corresponding to the gate regions PO-2, PO-3, PO-4, PO-5. The gate regions 721-729 configure, together with the active regions 711-714, a plurality of transistors (not numbered). The gate regions 720, 730 are dummy or non-functional gate regions corresponding to the gate regions PO-1, PO-6. The gate regions 720-730 are arranged along the X axis at the pitch CPP, resulting in a cell pitch of the circuit region 700 being 10 CPP along the Y axis. With the double cell height of 2h along the Y axis, the circuit region 700 occupies an area of 20 CPP.

A plurality of cut-poly regions of a cut-poly mask extend along the X axis and indicate areas where the gate regions disconnected. The cut-poly regions are schematically illustrated in the drawings with the label "CPO." For example, a cut-poly region 731 extends across gate regions 720-723, and indicates that each of the gate regions 720-723 is separated by the cut-poly region 731 into two gates. For another example, cut-poly regions 732, 733 extend across gate regions 726, 727, and indicates that each of the gate regions 726, 727 is separated by the cut-poly regions 732, 733 into three gates.

The circuit region 700 further comprises MD contact structures, and VD and VG via structures which electrically couple the gates and source/drains of the transistors in the circuit region 700 with each other and/or with other circuitry of the IC device. For simplicity, MD contact structures are omitted in FIG. 7A. Similarly to the circuit region 300 described with respect to FIGS. 3A-3C, MD contact structures in the circuit region 700 are over the active regions 711-714, in electrical contact with the corresponding source/drains of the transistors of the circuit region 700, and arranged alternatingly with the gate regions 720-730 along the X-axis. The pitch along the X axis between directly adjacent MD contact structures is CPP. Each of the VD via structures in the circuit region 700 is configured to electrically couple an underlying MD contact structure to an overlying M0 conductive pattern. Each of the VG via structures in the circuit region 700 is configured to electrically couple an underlying gate region to an overlying M0 conductive pattern.

The circuit region 700 further comprises a boundary (or cell boundary) 715 which comprises edges 716, 717, 718, 719. The edges 716, 717 are elongated along the X axis, and the edges 718, 719 are elongated along the Y axis. The edges 716, 717, 718, 719 are connected together to form the closed boundary 715 which is a place-and-route boundary as described herein. The rectangular shape of the boundary 715 is an example. Other boundary shapes for various cells are within the scope of various embodiments. The edges 716, 717 coincide with centerlines of corresponding M0 conductive patterns (not shown in FIG. 7A) as described herein.

The edges 718, 719 coincide with centerlines of dummy or non-functional gate regions 720, 730. Between the edges 716, 717 and along the Y axis, the circuit region 300 contains two PMOS active regions 711, 713, and two NMOS active regions 712, 714, and is considered to have a height corresponding to two cell heights, or double cell height, 2h.

FIG. 7B shows further layers in the layout diagram of the circuit region 700. For simplicity, the active regions 711-714 are schematically indicated by curly brackets (or braces), and the cut-poly regions and the boundary 715 are omitted in FIG. 7B.

The circuit region 700 further comprises an M0 layer over the VD and VG via structures. In some embodiments, all conductive patterns in the M0 layer belong to the same mask. In at least one embodiment and similarly to the circuit region 300 described with respect to FIGS. 3A-3C, conductive patterns in the M0 layer of the circuit region 700 are separated into several masks to meet one or more design and/or manufacturing requirements. For example, M0 conductive patterns 741, 743, 745, 747, 749 and the other unnumbered M0 conductive patterns in the same rows as the conductive patterns 741, 743, 745, 747, 749 correspond to one mask, e.g., a mask MOA. M0 conductive patterns 742, 744, 746, 748 and the other unnumbered M0 conductive patterns in the same rows as the conductive patterns 742, 744, 746, 748 correspond to another mask, e.g., a mask M0B. In the example configuration in FIG. 7B, all M0 conductive patterns in the circuit region 700 are 1D conductive patterns elongated along the X axis. The edges 716, 717 of the boundary 715 correspondingly coincide with centerlines of the conductive patterns 741, 749.

The circuit region 700 further comprises an VIA0 layer and an M1 layer sequentially over the M0 layer. The VIA0 layer comprises VIA0 (or V0) via structures each between and electrically coupling a corresponding M0 conductive pattern and a corresponding M1 conductive pattern. The M1 layer in the circuit region 700 comprises conductive patterns D, SI, SE, CP and Q which provide pin-outs corresponding to the inputs D, SI, SE, CP and the output Q of the circuit 600, for electrical connections of the circuit region 700 to the other circuitry of the IC device or to external circuitry. Other conductive patterns in the M1 layer provide internal electrical connections among the transistors of the circuit region 700. In the example configuration in FIG. 7B, an internal electrical connection between M1 conductive patterns 772, 775 includes two V1 via structures (not shown) over and in electrical contact with the M1 conductive patterns 772, 775, and an M2 conductive pattern (not shown) over and in electrical contact with the two V1 via structures.

A feature of the circuit region 700 comprises three consecutive V0 via structures 754, 755, 756 which are over and in electrical contact with three corresponding consecutive M0 conductive patterns 744, 745, 746, and electrically couple the corresponding M0 conductive patterns 744, 745, 746 to an M2 conductive pattern 779. The M0 conductive patterns 744, 745, 746 are considered consecutive, because the M0 conductive pattern 745 is between and directly adjacent the M0 conductive patterns 744, 746 along the Y axis. Two M0 conductive patterns are considered directly adjacent along the Y axis where there are no other M0 conductive patterns therebetween. The described arrangement of three consecutive V0 via structures is an example. Other configurations with more than three consecutive via structures are within the scopes of various embodiments.

A further feature of the circuit region 700 comprises a 2D conductive pattern 760 in the M1 layer. Other conductive patterns in the M1 layer are 1D conductive patterns elongated along the Y axis. In at least one embodiment, the shapes of the 1D conductive patterns in the M1 layer are rectangles. The conductive pattern 760 is a 2D conductive pattern which extends along both the X axis and the Y axis.

Specifically, the conductive pattern 760 has shape of a square bracket (also referred to herein as "bracket-shape"), and comprises a first section 761, a second section 762 contiguous to a first portion (lower portion in FIG. 7B) of the first section 761, and a third section 763 contiguous to a second portion (upper portion in FIG. 7B) of the first section 761. The first section 761 is a rectangle elongated along the Y axis. The first section 761 is considered as a 1D conductive pattern similarly to the other 1D conductive patterns of the M1 layer. The 1D conductive patterns of the M1 layer, including the first section 761, are arranged at the same pitch CPP along the X axis. In some embodiments, the first section 761 and the other 1D conductive patterns of the M1 layer have the same width along the X axis. In some embodiments, along the Y axis, a centerline of each 1D conductive pattern of the M1 layer coincides, or is aligned with, a centerline of an underlying MD contact structure. In the example configuration in FIG. 7B, the first section 761 is over and in electrical contact with an underlying V0 via structure 764, which electrically couples the first section 761 to an M0 conductive pattern 765.

While the first section 761 is considered as a 1D conductive pattern elongated along the Y axis, each of the second section 762 and the third section 763 is considered as a lateral conductive pattern contiguous with and projecting, along the X axis, from the 1D conductive pattern or first section 761. The second section 762 is over the M0 conductive pattern 748 and is electrically coupled to the underlying M0 conductive pattern 748 by a V0 via structure 766. The third section 763 is over the M0 conductive pattern 767 and is electrically coupled to the underlying M0 conductive pattern 767 by a V0 via structure 768. As a result, the M0 conductive patterns 748, 765, 767 are electrically coupled together by the 2D conductive pattern 760.

In the example configuration in FIG. 7B, the second section 762 and third section 763 project from the first section 761 in the same direction along the X axis toward the three consecutive V0 via structures 754, 755, 756. Other configurations where the second section 762 and third section 763 project from the first section 761 in opposite directions are within the scopes of various embodiments. In the example configuration in FIG. 7B, each of the second section 762 and third section 763 overlaps, along the Y axis, the whole width of the M1 conductive pattern 777 which is directly adjacent to the first section 761. Other configurations where at least one of the second section 762 or the third section 763 overlaps, along the Y axis, a portion, or no portion, of the width of the M1 conductive pattern 777 are within the scopes of various embodiments. In some embodiments, the second section 762 and the third section 763 have different widths along the X axis. In at least one embodiment, one of the second section 762 and the third section 763 is omitted. In one or more embodiments, more than two lateral conductive patterns are contiguous with and projecting from the 1D conductive pattern or first section 761.

Figure 7D:
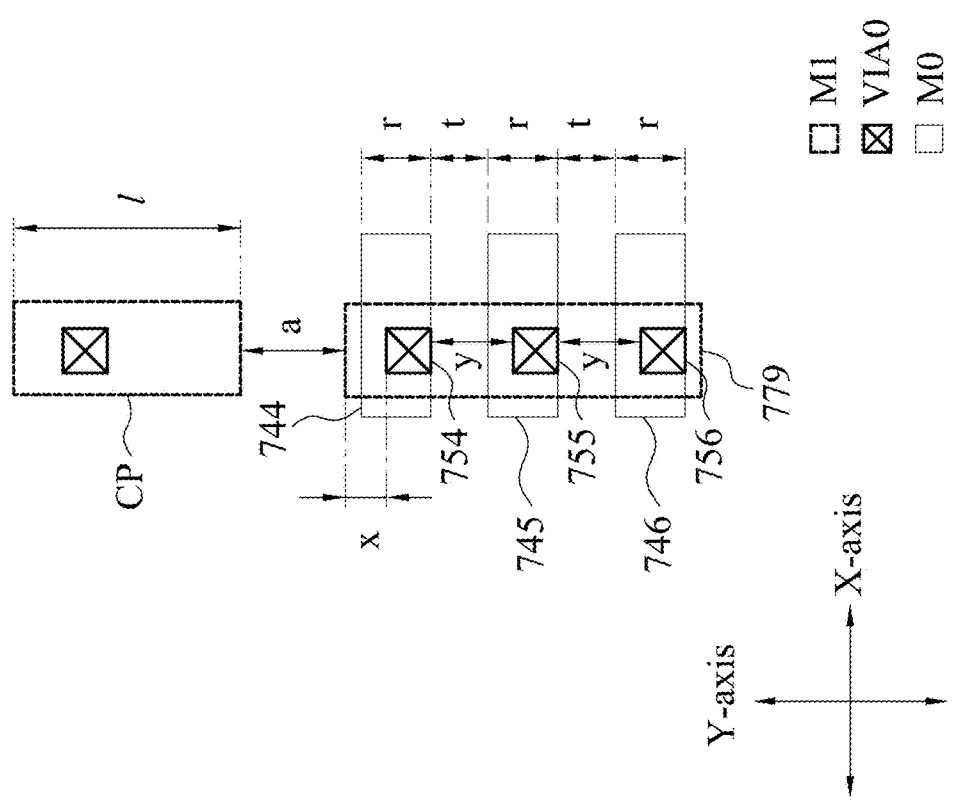
FIGS. 7C and 7D are enlarged schematic views of various portions of a layout diagram of a circuit region of an IC device, in accordance with some embodiments.
Figure 7C:
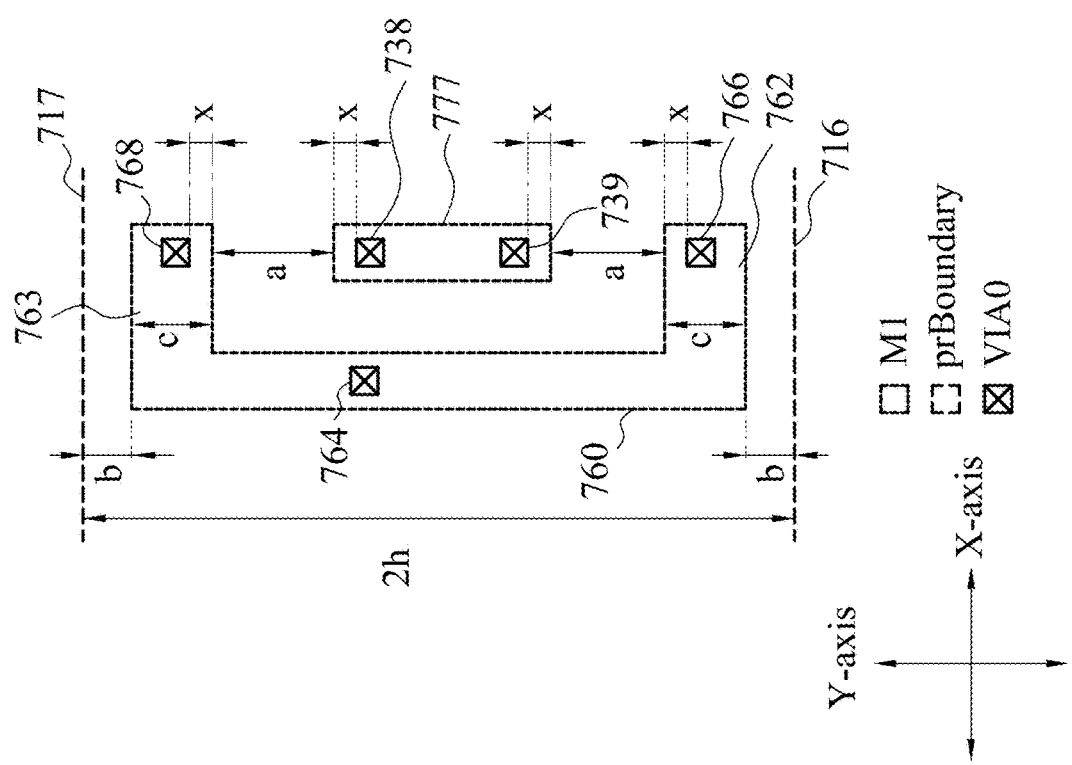

FIG. 7C is an enlarged schematic view of a portion containing the M1 conductive patterns 760, 777 in FIG. 7B. FIG. 7D is an enlarged schematic view of a portion containing the M1 conductive patterns CP, 779 in FIG. 7B. In FIGS. 7C-7D, a plurality of design rules related to conductive patterns in the M0 and M1 layers, and via structures in the underlying VIA0 layer are described.

In FIG. 7C, as described herein, h is one cell height, and the cell height of the circuit region 700 is 2h. In the 2D conductive pattern 760, a minimal width of the lateral conductive pattern 762 along the Y axis is c. A minimal distance along the Y axis between the lateral conductive pattern 762 or 763 and the adjacent M1 conductive pattern 777 is a. A minimal distance along the Y axis from each M1 conductive pattern, e.g., 760, to the closest edge, e.g., 716, 717, of the cell boundary is b. A minimal distance along either the X axis or Y axis from a V0 via structure, e.g., 738 or 739, to the closest edge of the overlying M1 conductive pattern, e.g., 777, is x.

In FIG. 7D, a minimal length of each M1 conductive pattern, e.g., CP, along the Y axis is L. A minimal distance along the Y axis between adjacent M1 conductive patterns, e.g., CP and 779, is a. A minimal distance along the Y axis between adjacent V0 via structures, e.g., 754 and 755, is y. A minimal width of each M0 conductive pattern, e.g., 744, is r. A minimal distance along the Y axis between adjacent M0 conductive patterns, e.g., 744 and 745, is t. In some embodiments, h is 50 nm~300 nm, c≥1 nm, b≥1 nm, a≥1 nm, x is 0 nm~50 nm, y≥1 nm, r≥1 nm, t≥1 nm, l≥1 nm. These specific design rules are examples. Other design rules are within the scopes of various embodiments.

In some embodiments, by using a 2D conductive pattern, such as the 2D conductive pattern 760, together with three or more consecutive via structures, such as the via structures 754, 755, 756, it is possible to provide routing to various transistors in the circuit region 700, while keeping the cell pitch (or width along the X axis) of the circuit region 700 at a desired low value of 10 CPP, resulting in a cell area of 20 CPP for the SDFQD1 cell. As a result, it is possible, in one or more embodiments, to reduce the area and/or increase the gate density of the circuit region 700. Such advantages are significant design considerations at advanced manufacturing nodes where the design rules are strict and/or dimensions of various features are minimized extensively. The described advantages in accordance with some embodiments may not be achievable in other approaches that do not use 2D conductive patterns, especially at advanced manufacturing nodes. For example, the other approaches need 22 CPP for the SDFQD1 cell.

Figure 8:
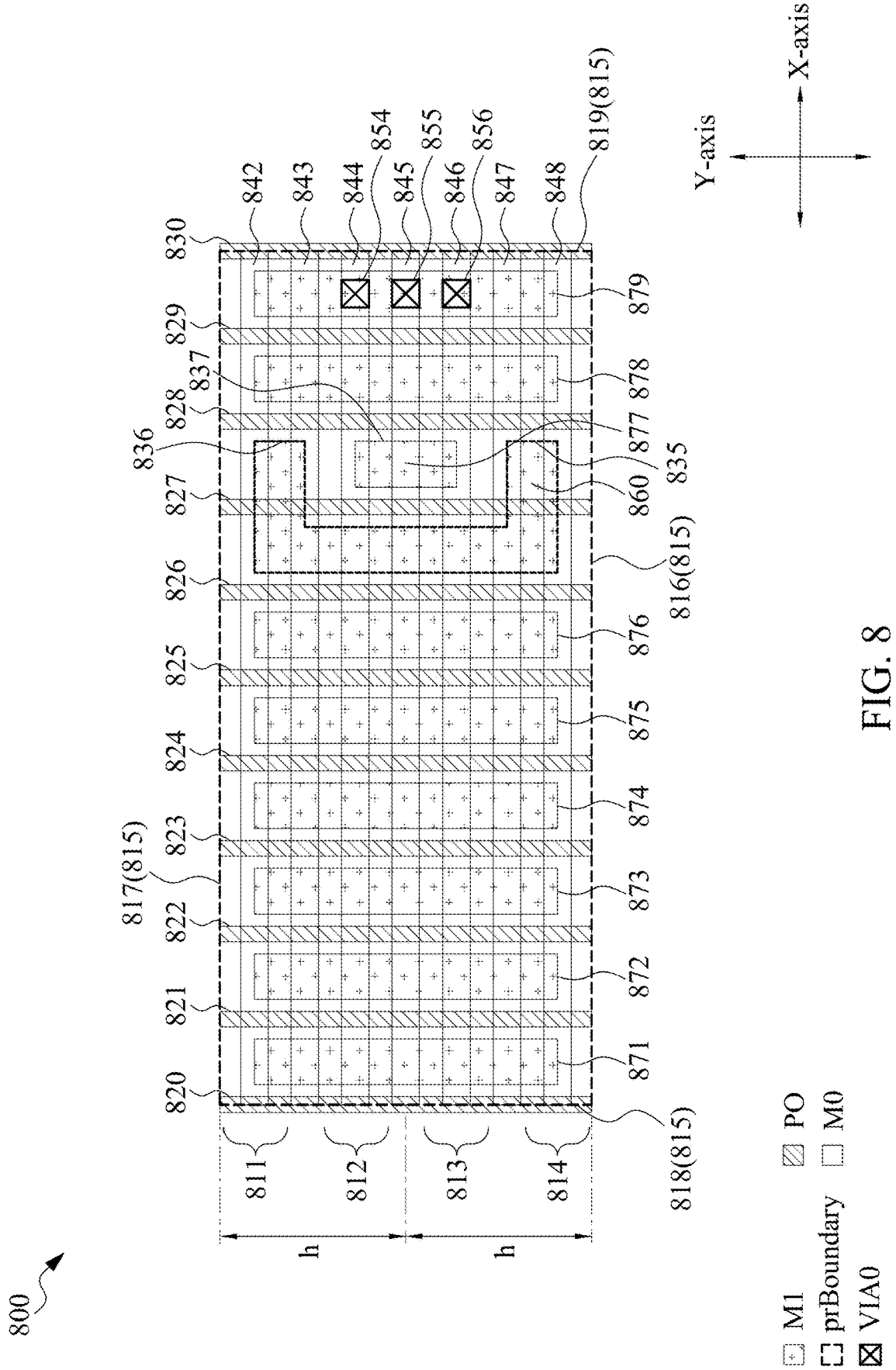
FIG. 8 is a simplified schematic view of a layout diagram of a circuit region of an IC device, in accordance with some embodiments.

FIG. 8 is a simplified schematic view of a layout diagram of a circuit region 800 of an IC device, in accordance with some embodiments. In at least one embodiment, the circuit region 800 corresponds to the circuit region 700, and FIG. 8 is a simplified view of FIG. 7B. In some embodiments, FIG. 8 is a simplified schematic view of a layout diagram of a standard cell, such as an SDFQD1 cell, stored in a standard cell library on a non-transitory computer-readable medium. Components in FIG. 8 having corresponding components in FIGS. 7A-7B are designated by the reference numerals of FIGS. 7A-7B increased by 100.

The circuit region 800 comprises a boundary (or cell boundary) 815 which comprises edges 816, 817, 818, 819. The edges 816, 817 are elongated along the X axis, and the edges 818, 819 are elongated along the Y axis. The edges 816, 817, 818, 819 are connected together to form the closed boundary 815 which is a place-and-route boundary as described herein. The rectangular shape of the boundary 815 is an example. Other boundary shapes for various cells are within the scope of various embodiments.

The circuit region 800 further comprises, in the boundary 815, active regions 811-814, gate regions 821-829, M0 conductive patterns 842-848, and M1 conductive patterns 860 and 871-879. Dummy or non-functional gate regions 820, 830 are arranged along the corresponding edges 817, 818 of the boundary 815. The edge 816 is along a centerline of the conductive pattern 749. The edge 817 is along a centerline of the conductive pattern 741. Between the edges 816, 817 and along the Y axis, the circuit region 800 contains two PMOS active regions 811, 813, and two NMOS active region 812, 814, and is considered to have a double cell height 2h.

Compared to the layout diagram of the circuit region 700 in FIGS. 7A-7B, the layout diagram of the circuit region 800 in FIG. 8 is simplified in that various via structures are omitted. Further, one or more of the M0 conductive patterns 842-848 are simplified representations of corresponding M0 conductive patterns in FIGS. 7A-7B. For example, the conductive pattern 842 is a simplified representation of the corresponding M0 conductive patterns 742, 767 and three other (not numbered) M0 conductive patterns in the same row along the X axis in FIG. 7B, and the conductive pattern 842 does not show that the corresponding M0 conductive patterns in FIG. 7B are disconnected from each other. One or more of the M1 conductive patterns 871-879 are simplified representations of corresponding M1 conductive patterns in FIGS. 7A-7B. For example, the conductive pattern 879 is a simplified representation of the corresponding conductive patterns CP and 779 in FIG. 7B, and does not show that the corresponding conductive patterns CP and 779 in FIG. 7B are disconnected from each other. For another example, the conductive pattern 875 is a simplified representation of the corresponding conductive pattern 775, and does not necessarily reflect the actual length of the conductive pattern 775 along the Y axis. The conductive pattern 860 is a 2D conductive pattern, and the other M0 and M1 conductive patterns in the circuit region 800 are 1D conductive patterns. In the example configuration in FIG. 8, the conductive pattern 860 has edges 835, 836 aligned along the Y axis with an edge 837 of the conductive pattern 877. In other words, the conductive pattern 860 overlap, along the Y axis, the whole width of the conductive pattern 877. Other arrangements of at least one of the edge 835 or edge 836 of the conductive pattern 860 relative to the edge 837 of the conductive pattern 877 are within the scopes of various embodiments, as described herein.

Figure 9A:
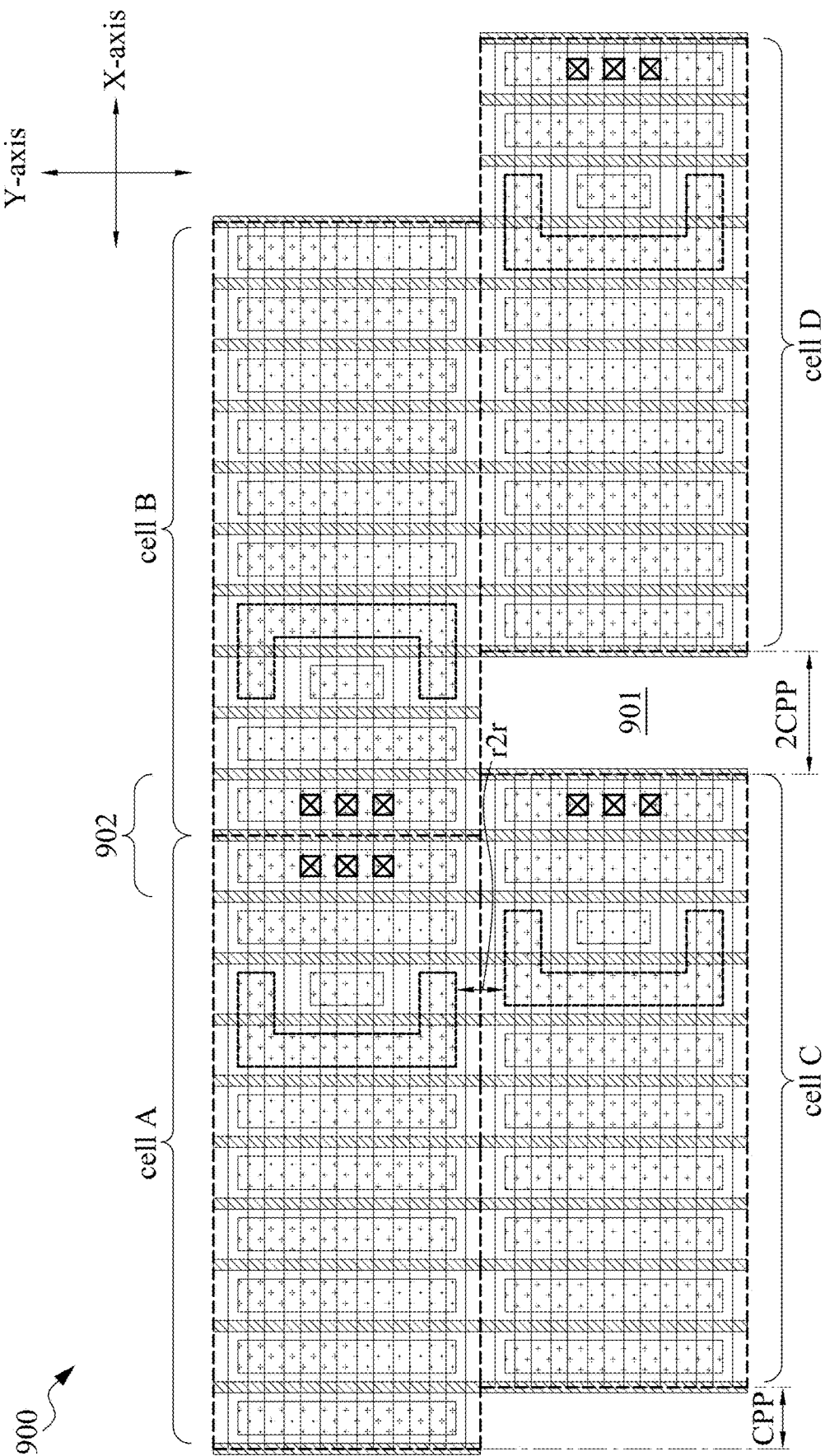
FIG. 9A is a simplified schematic view of a layout diagram of a circuit region constituting various cells in an IC device, in accordance with some embodiments.

FIG. 9A is a simplified schematic view of a layout diagram of a circuit region 900 constituting various cells in an IC device, in accordance with some embodiments.

The circuit region 900 comprises cells A-D placed in abutment with each other along the X axis or the Y axis. In the example configuration in FIG. 9A, each of the cells A, C and D corresponds to the circuit region 800, and the cell B is symmetrical to the cell A across the Y axis. In other words, the layout diagram of the cell B is obtained by flipping the layout diagram of the cell A across the Y axis. As a result, the example configuration of the circuit region 900 in FIG. 9A comprises four SDFQD1 cells.

In at least one embodiment, each of the cells A-D is stored in, and retrieved from, a cell library, and is placed by an APR tool into a layout diagram of the circuit region 900. For example, the cell A and the cell B are placed to abut each other in a direction of the X axis, along a common edge which extends along the Y axis and which, before abutment, corresponds to the edge 819 of the cell A and the edge 819 of the cell B (flipped cell A). The cell A and the cell C are placed to abut each other in a direction of the Y axis, along a common edge which extends along the X axis and which, before abutment, corresponds to the edge 816 of the cell A and the edge 817 of the cell C. In the example configuration in FIG. 9A, the cell C is shifted along the X axis to the right side relative to the cell A by 1 CPP. Other configurations are within the scopes of various embodiments. For example, the cell C is not shifted with respect to the cell A, or the cell C is shifted along the X axis to the left side relative to the cell A, or the cell C is shifted along the X axis relative to the cell A by more than 1 CPP. The cell B and the cell D are placed to abut each other in the direction of the Y axis, along a common edge which extends along the X axis and which, before abutment, corresponds to the edge 816 of the cell B (flipped cell A) and the edge 817 of the cell D. In the example configuration in FIG. 9A, the cell D is shifted along the X axis to the right side relative to the cell D by 3 CPP, resulting in a gap 901 of a size of 2 CPP along the X axis. Other configurations are within the scopes of various embodiments. For example, the cell D abuts the cell C, or the cell D is shifted relative to the cell C by a gap other than 2 CPP.

In some embodiments, when a gap exists between adjacent cells, such as the gap 901 between the cells C and D, one or more other cells are placed to fill fully or partly the gap. Examples cells include, but are not limited to, a function cell, an engineering change order (ECO) cell, a filler cell, a physical cell, or another type of cell or combination of cells capable of being defined in an IC layout diagram.

Figure 9B:
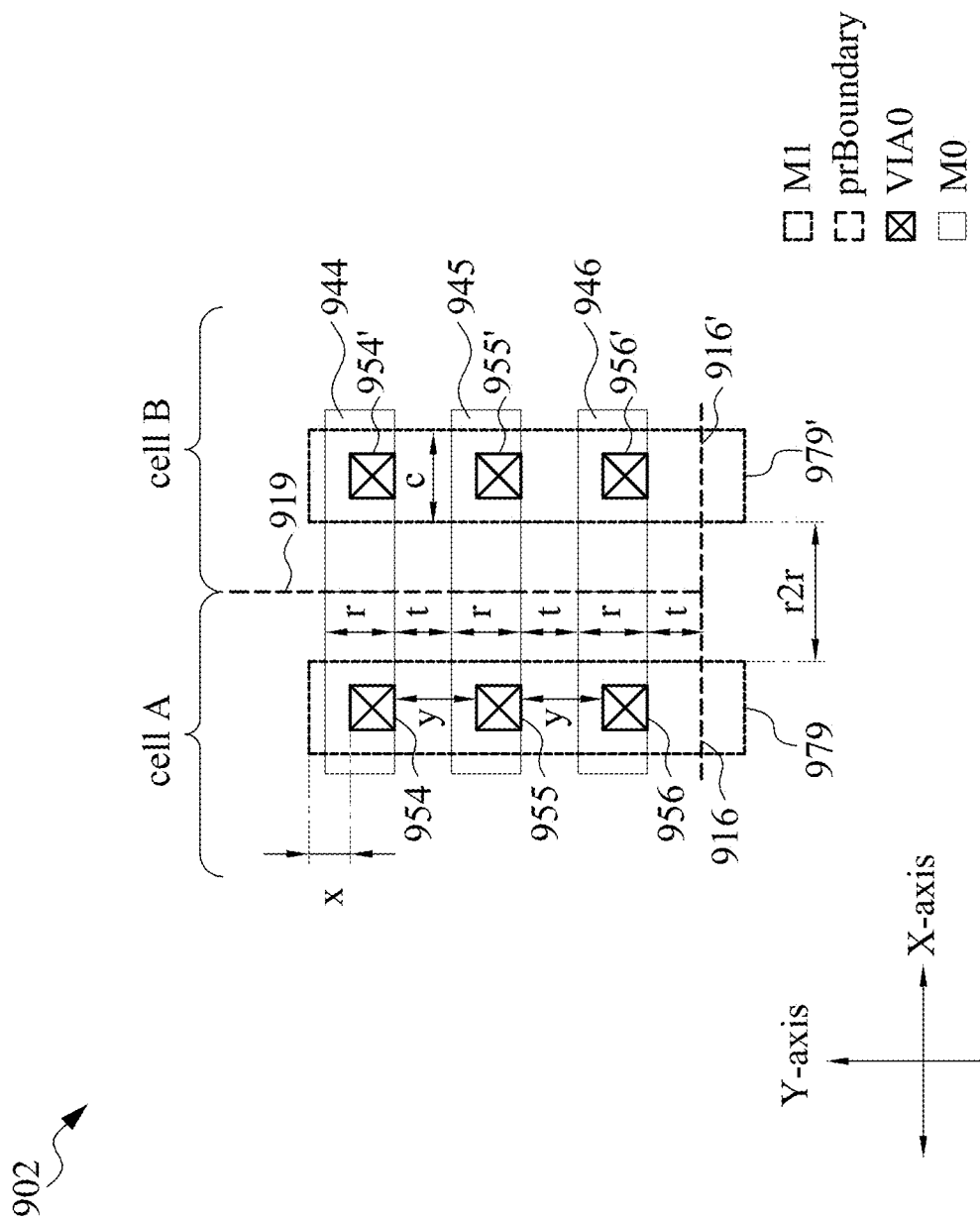
FIG. 9B is an enlarged schematic view of a portion of a layout diagram of a circuit region of an IC device, in accordance with some embodiments.

FIG. 9B is an enlarged schematic view of a portion 902 contains six via structures in FIG. 9A, including three consecutive via structures of the cell A, and three consecutive via structures of the cell B.

Specifically, as shown FIG. 9B, the cell A abuts the cell B along a common edge 919 corresponding to the edge 819. An edge 916 of the cell A is aligned with the edge 916' of the cell B along the X axis. The edges 916, 916' correspond to the edge 816. The cell A comprises three consecutive V0 via structures 954, 955, 956 corresponding to three consecutive V0 via structures 854, 855, 856. The three consecutive via structures 954, 955, 956 are between an M1 conductive pattern 979 and the three corresponding M0 conductive patterns 944, 945, 946. The M1 conductive pattern 979 corresponds to the conductive pattern 879. The three M0 conductive patterns 944, 945, 946 correspond to the conductive patterns 844, 845, 846. The cell B comprises three consecutive V0 via structures 954', 955', 956' corresponding to three consecutive V0 via structures 854, 855, 856. The three consecutive via structures 954', 955', 956' are between an M1 conductive pattern 979' and the three corresponding M0 conductive patterns 944, 945, 946. The M1 conductive pattern 979' corresponds to the conductive pattern 879.

In some embodiments, various design rules, e.g., x, y, r, t, c, related to M0 and M1 conductive patterns and via structures described with respect to one or more of FIGS. 3C, 7C, 7D are applicable to the M0 and M1 conductive patterns and via structures in FIG. 9B. In FIG. 9B, a further design rule r2r designates a minimal distance along the X axis between adjacent M1 conductive patterns, e.g., 979 and 979'. This design rule r2r also designates a minimal distance along the Y axis between adjacent 2D conductive patterns in the M1 layer, as indicated in FIG. 9A. In some embodiments, r2r≥1 nm. These specific design rules are examples. Other design rules are within the scopes of various embodiments. In at least one embodiment, one or more advantages described herein are achievable in an IC device including a circuit region corresponding to the layout diagram in FIG. 9A. In at least one embodiment, the arrangement of six V0 via structures in a portion of a layout diagram, as described with respect to FIG. 9B, provides awareness of the presence of one or more associated 2D conductive patterns and helps a human circuit designer to take appropriate consideration in designing and/or optimizing the layout diagram.

Figure 10:
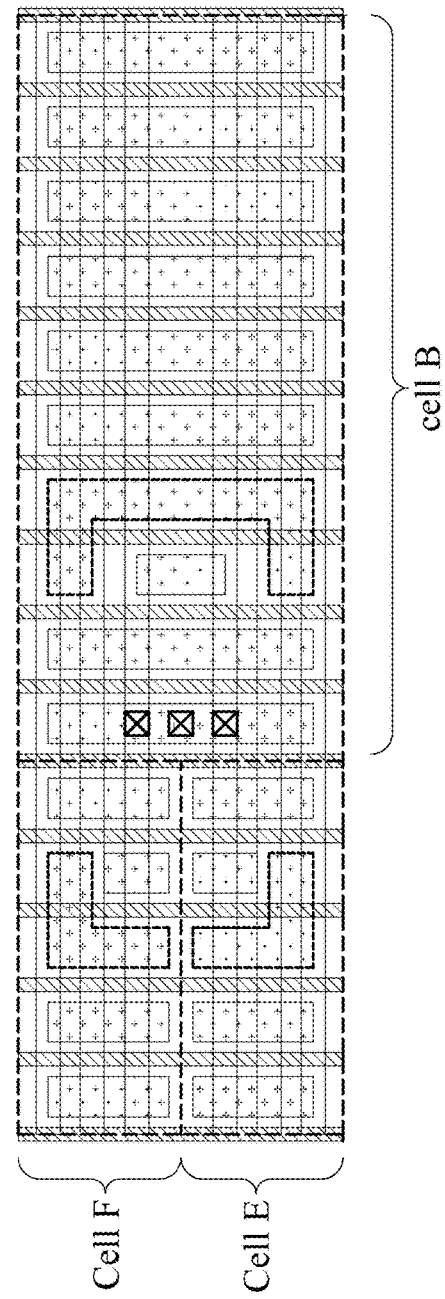
FIG. 10 is a simplified schematic view of a layout diagram of a circuit region constituting various cells in an IC device, in accordance with some embodiments.
Figure 10:
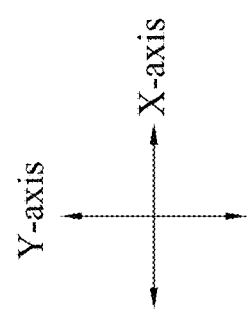

FIG. 10 is a simplified schematic view of a layout diagram of a circuit region 1000 constituting various cells in an IC device, in accordance with some embodiments.

The circuit region 1000 comprises cells B, E, F placed in abutment with each other along the X axis or the Y axis. In the example configuration in FIG. 10, the cell E corresponds to the circuit region 500, the cell F is symmetrical to the cell E across the X axis, and the cell B is symmetrical to the cell A across the Y axis as described with respect to FIG. 9A. In other words, the layout diagram of the cell F is obtained by flipping the layout diagram of the cell E across the X axis. As a result, the example configuration of the circuit region 1000 in FIG. 10 comprises one SDFQD1 cell (cell B) and two AOI22D1 cells (cells E and F).

In at least one embodiment, each of the cells B, E, F is stored in, and retrieved from, a cell library, and is placed by an APR tool into a layout diagram of the circuit region 1000. For example, the cell E and the cell F are placed to abut each other in a direction of the Y axis, along a common edge which extends along the X axis and which, before abutment, corresponds to the edge 562 of the cell E and the edge 562 of the cell F (flipped cell E). The abutted cells E and F are placed to abut the cell B in a direction of the X axis, along a common edge which extends along the Y axis and which, before abutment, corresponds to the edge 564 of the cell E, F and the edge 819 of the cell B. In the example configuration in FIG. 10, there are no gaps among the cells B, E, F. Other configurations are within the scopes of various embodiments. In some embodiments, various design rules related to M0 and M1 conductive patterns and via structures described with respect to one or more of FIGS. 3C, 7C, 7D, 9B are applicable to the M0 and M1 conductive patterns and via structures in FIG. 10. In at least one embodiment, one or more advantages described herein are achievable in an IC device including a circuit region corresponding to the layout diagram in FIG. 10.

In the example configurations in FIGS. 9A and 10, each cell having a 2D conductive pattern is placed in abutment with another cell also having a 2D conductive pattern. Other configurations are within the scopes of various embodiments. For example, in at least one embodiment, a cell having a 2D conductive pattern is placed in abutment with one or more other cells none of which have a 2D conductive pattern.

Figure 11A:
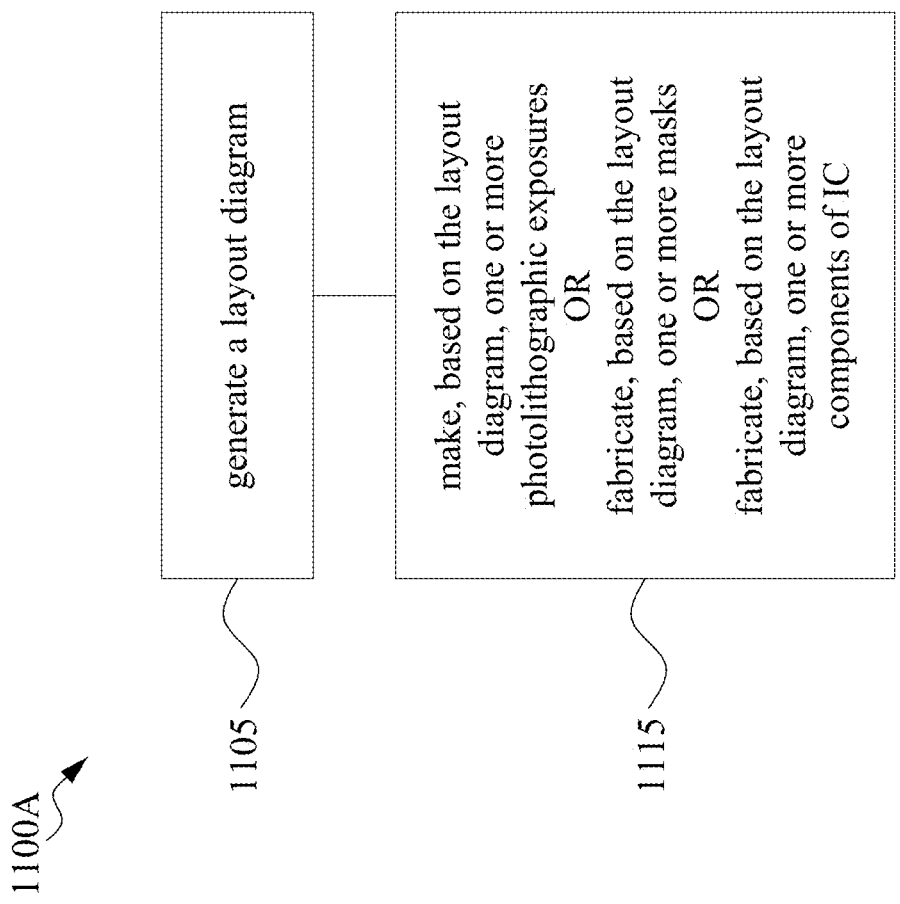
FIGS. 11A-11C are flowcharts of various methods, in accordance with some embodiments.

FIG. 11A is a flowchart of a method 1100A of generating a layout diagram and using the layout diagram to manufacture an IC device, in accordance with some embodiments.

Method 1100A is implementable, for example, using EDA system 1200 (FIG. 12, discussed below) and an integrated circuit (IC) manufacturing system 1300 (FIG. 13, discussed below), in accordance with some embodiments. Regarding method 1100A, examples of the layout diagram include the layout diagrams disclosed herein, or the like. Examples of an IC device to be manufactured according to method 1100A include IC device 100 in FIG. 1 and/or IC device 400 in FIG. 4. In FIG. 11A, method 1100A includes blocks 1105, 1115.

At block 1105, a layout diagram is generated which, among other things, include patterns represent one or more circuit regions as described with respect to FIGS. 1-10, or the like. An example of an IC device corresponding to a layout diagram generated by block 1105 includes IC device 100 of FIG. 1 and/or IC device 400 in FIG. 4. Block 1105 is discussed in more detail below with respect to FIG. 11B. From block 1105, flow proceeds to block 1115.

At block 1115, based on the layout diagram, at least one of (A) one or more photolithographic exposures are made or (B) one or more semiconductor masks are fabricated or (C) one or more components in a layer of an IC device are fabricated. Block 1115 is discussed in more detail below with respect to FIG. 11C.

Figure 11B:
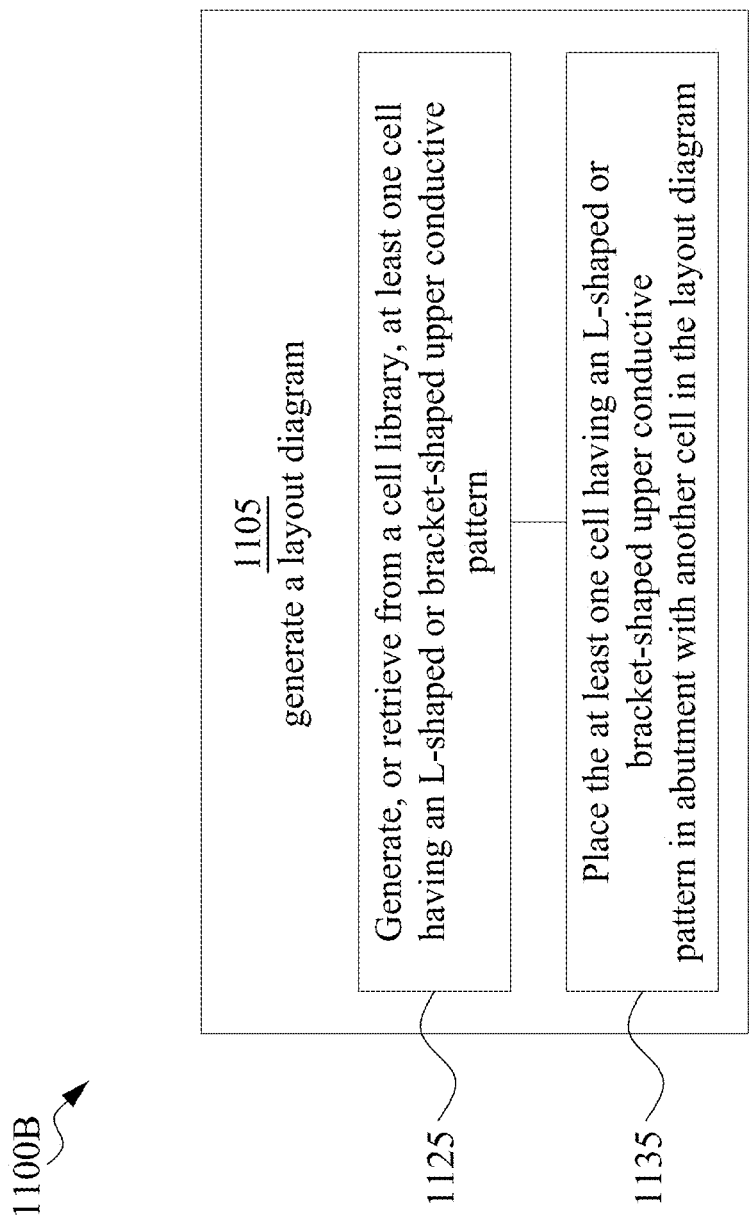

FIG. 11B is a flowchart of a method 1100B of generating a layout diagram, in accordance with some embodiments. More particularly, the flowchart of FIG. 11B shows additional blocks that demonstrates one example of procedures implementable in block 1105 of FIG. 11A, in accordance with one or more embodiments. In FIG. 11B, block 1105 includes blocks 1125, 1135.

At block 1125, at least one cell having an L-shaped or bracket-shaped upper conductive pattern is generated, or retrieved from a cell library. For example, a cell corresponding to one or more of the layout diagrams described with respect to FIGS. 3A-3C and 5 is generated, or retrieved from a cell library, to include an L-shaped M1 conductive pattern, e.g., M1-3 or 5M1-3. For another example, a cell corresponding to one or more of the layout diagrams described with respect to FIGS. 7A-7D, 8 is generated, or retrieved from a cell library, to include a bracket-shaped M1 conductive pattern, e.g., 760 or 860.

At block 1135, the at least one cell having an L-shaped or bracket-shaped upper conductive pattern is placed in abutment with another cell in the layout diagram. For example, a cell having an L-shaped M1 conductive pattern, e.g., cells E-F, or a cell having a bracket-shaped M1 conductive pattern, e.g., cells A-D, is placed in abutment with another cell in the layout diagram of an IC device, as described with respect to FIGS. 9A-9B, 10. In at least one embodiment, the generated layout diagram of the IC device is stored on a non-transitory computer-readable medium.

Figure 11C:
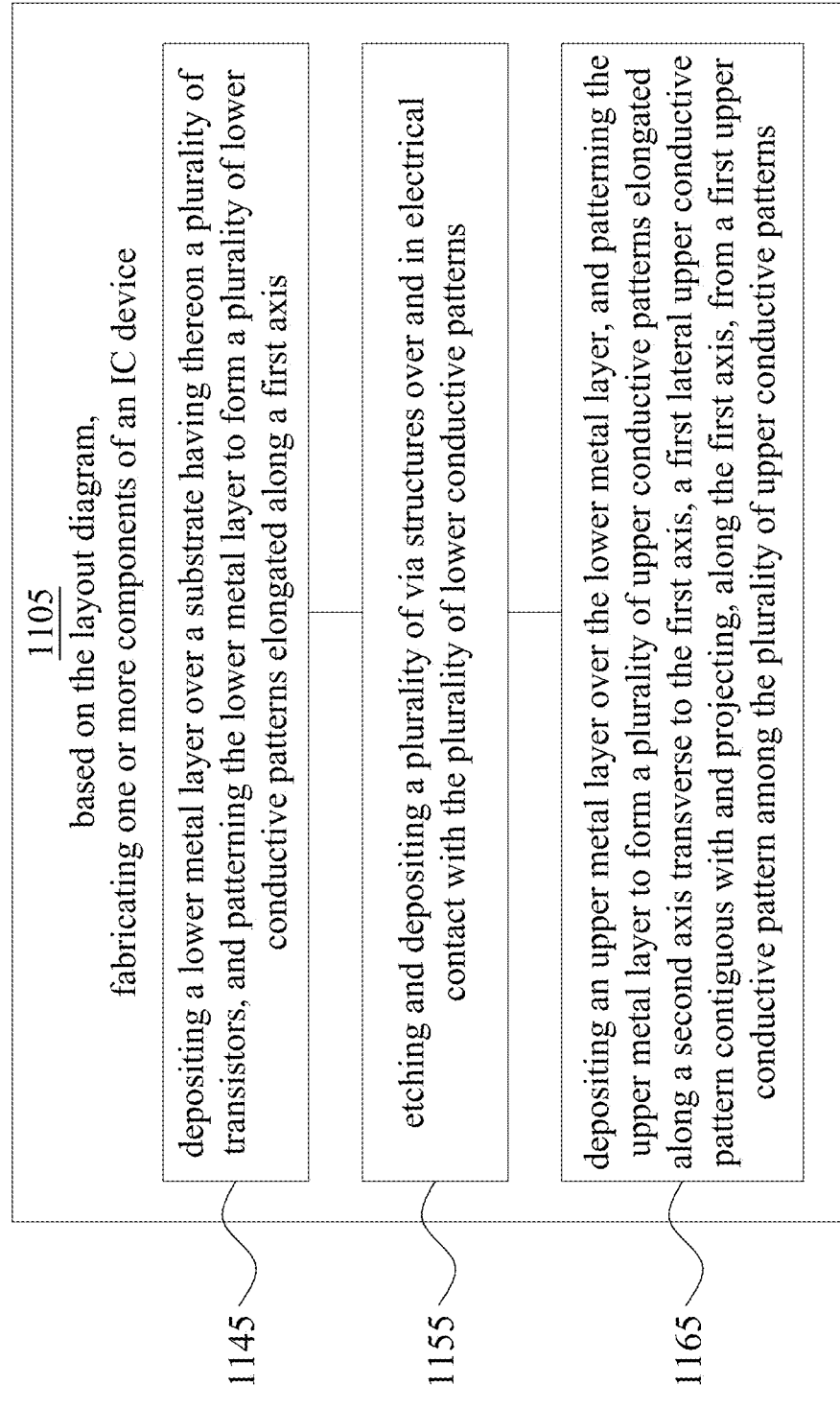

FIG. 11C is a flowchart of a method 1100C of fabricating one or more components of an IC device, based on the layout diagram, in accordance with some embodiments. More particularly, the flowchart of FIG. 11C shows additional blocks that demonstrates one example of procedures implementable in block 1115 of FIG. 11A, in accordance with one or more embodiments. In FIG. 11C, block 1115 includes blocks 1145, 1155, 1165.

At block 1145, a lower metal layer is deposited over a substrate having thereon a plurality of transistors, and is patterned to form a plurality of lower conductive patterns elongated along a first axis, e.g., the X axis. In some embodiments, the lower conductive patterns correspond to one or more of the M0 conductive patterns described with respect to FIGS. 3B, 4, 5, 7B, 7D, 8.

An example manufacturing process starts from a substrate, such as the substrate 430 described with respect to FIG. 4. The substrate comprises, in at least one embodiment, silicon, silicon germanium (SiGe), gallium arsenic, or other suitable semiconductor materials. Active regions are formed in or over the substrate, using one or more masks corresponding to one or more active regions in the layout diagrams described herein. A gate dielectric material layer is deposited over the substrate. Example materials of the gate dielectric material layer include, but are not limited to, a high-k dielectric layer, an interfacial layer, and/or combinations thereof. In some embodiments, the gate dielectric material layer is deposited over the substrate by atomic layer deposition (ALD) or other suitable techniques. A gate electrode layer is deposited over the gate dielectric material layer. Example materials of the gate electrode layer include, but are not limited to, polysilicon, metal, Al, AlTi, Ti, TiN, TaN, Ta, TaC, TaSiN, W, WN, MoN, and/or other suitable conductive materials. In some embodiments, the gate electrode layer is deposited by chemical vapor deposition (CVD), physical vapor deposition (PVD or sputtering), plating, atomic layer deposition (ALD), and/or other suitable processes. A patterning process is then performed, using one or more masks corresponding to one or more gate electrodes in the layout diagrams described herein. As a result, the gate dielectric material layer is patterned in to one or more gate dielectric layers, such as the gate dielectric layers 451-454, and the gate electrode layer is patterned into one or more gate electrodes, such as the gate electrode 4PO-4, 4PO-5 described with respect to FIG. 4. In at least one embodiment, spacers are formed, by deposition and patterning, on opposite sides of each gate electrode. Example materials of the spacers include, but are not limited to, silicon nitride, oxynitride, silicon carbide and other suitable materials. Example deposition processes include, but are not limited to, plasma enhanced chemical vapor deposition (PECVD), low-pressure chemical vapor deposition (LPCVD), sub-atmospheric chemical vapor deposition (SACVD), atomic layer deposition (ALD), or the like. Example patterning processes include, but are not limited to, a wet etch process, a dry etch process, or combinations thereof. Drain/source regions, such as the drain/source regions 441-444 described with respect to FIG. 4, are formed in the active regions of the substrate. In at least one embodiment, the drain/source regions are formed by using the gate electrodes and the spacers as a mask. For example, the formation of the drain/source regions is performed by an ion implantation or a diffusion process. Depending on the type of the devices or transistors, the drain/source regions are doped with p-type dopants, such as boron or $BF_2$, n-type dopants, such as phosphorus or arsenic, and/or combinations thereof. A conductive layer, e.g., a metal, is deposited over the substrate, thereby making electrical connections to the drain/source regions. A planarizing process is performed to planarize the conductive layer, resulting in contact structures, such as the contact structures 4MD-3, 4MD-8, 4 MD-9, 4MD-10 described with respect to FIG. 4, in electrical contact with the underlying drain/source regions. The planarizing process comprises, for example, a chemical mechanical polish (CMP) process. A dielectric layer is deposited over the substrate with the drain/source contacts formed thereon. The dielectric layer is etched, and the etched portions are filled with a conductive material, such as a metal, to form one or more via structures, such as the VD and VG via structures 4VD-2, 4VD-5, 4VG-3, 4VG-4 described with respect to FIG. 4. A planarizing process is performed. An M0 layer including a conductive material, such as a metal, is deposited over the planarized structure and patterned to form various M0 conductive patterns, such as the M0 conductive patterns 4M0B-1, 4M0A-3, 4M0B-4, 4M0B-5 described with respect to FIG. 4.

At block 1155, deposition and etching are performed to form a plurality of via structures over and in electrical contact with the lower conductive patterns. In some embodiments, the via structures correspond to one or more of the V0 via structures described with respect to FIGS. 3B, 3C, 4, 7B, 7C, 7D, 8.

In an example process, a dielectric layer is deposited over the patterned M0 layer. The dielectric layer is etched, and the etched portions are filled with a conductive material, such as a metal, to form one or more via structures in a V0 layer. For example, the V0 layer comprises the V0 via structures 4V0-4, 4V0-5 described with respect to FIG. 4. A planarizing process is then performed.

At block 1165, an upper metal layer is deposited and patterned to form a plurality of upper conductive patterns elongated along a second axis, e.g., the Y axis, transverse to the first axis, i.e., the X axis. The patterning further forms a lateral upper conductive pattern contiguous with and projecting, along the first axis, from a first upper conductive pattern among the plurality of upper conductive patterns. In some embodiments, the plurality of upper conductive patterns elongated along the Y axis correspond to one or more of the M1 conductive patterns described with respect to FIGS. 3B, 3C, 4, 5, 7B, 7C, 7D, 8. In at least one embodiment, the lateral upper conductive pattern corresponds to the lateral M1 conductive pattern 322, 422 contiguous with and projecting, along the X axis, from the first M1 conductive pattern 321, 421 as described with respect to FIGS. 3B, 4. In one or more embodiments, the lateral upper conductive pattern corresponds to the lateral M1 conductive pattern 762, 763 contiguous with and projecting, along the X axis, from the first M1 conductive pattern 761 as described with respect to FIG. 7B.

In an example process, an M1 layer including a conductive material, such as a metal, is deposited over the planarized structure obtained at the end of the formation of the V0 via structures. The M1 layer is patterned to form various M1 conductive patterns, such as the conductive patterns 4M1-3, 4M1-5 described with respect to FIG. 4. The M1 conductive patterns 4M1-3, 4M1-5 are electrically coupled to the corresponding M0 conductive patterns 4M0B-4, 4M0B-5 through the corresponding via structures 4V0-4, 4V0-5, as described with respect to FIG. 4.

In some embodiments, the process further comprises etching and depositing at least one through via structure and depositing and patterning a BM0 layer. In some embodiments, as described with respect to FIG. 4, at least one through via is etched from a back side 432 of the substrate 430 toward a front side 431 of the substrate 430 which has transistors, e.g., 4NA1, 4NA2, thereon. A conductive material, e.g., a metal, is deposited in the etched via to form the through via structure 4VB-3. The through via structure 4VB-3 is in electrical contact with at least one of the transistors, e.g., the transistor 4NA2. A BM0 layer is deposited on the back side 432 of the substrate 430, and is patterned to form a BM0 conductive pattern 435 in electrical contact with the through via structure 4VB-3. In at least one embodiment, the BM0 conductive pattern 435 is configured as a power rail.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EAD system is usable as part of a design house of an IC manufacturing system discussed below.

Figure 12:
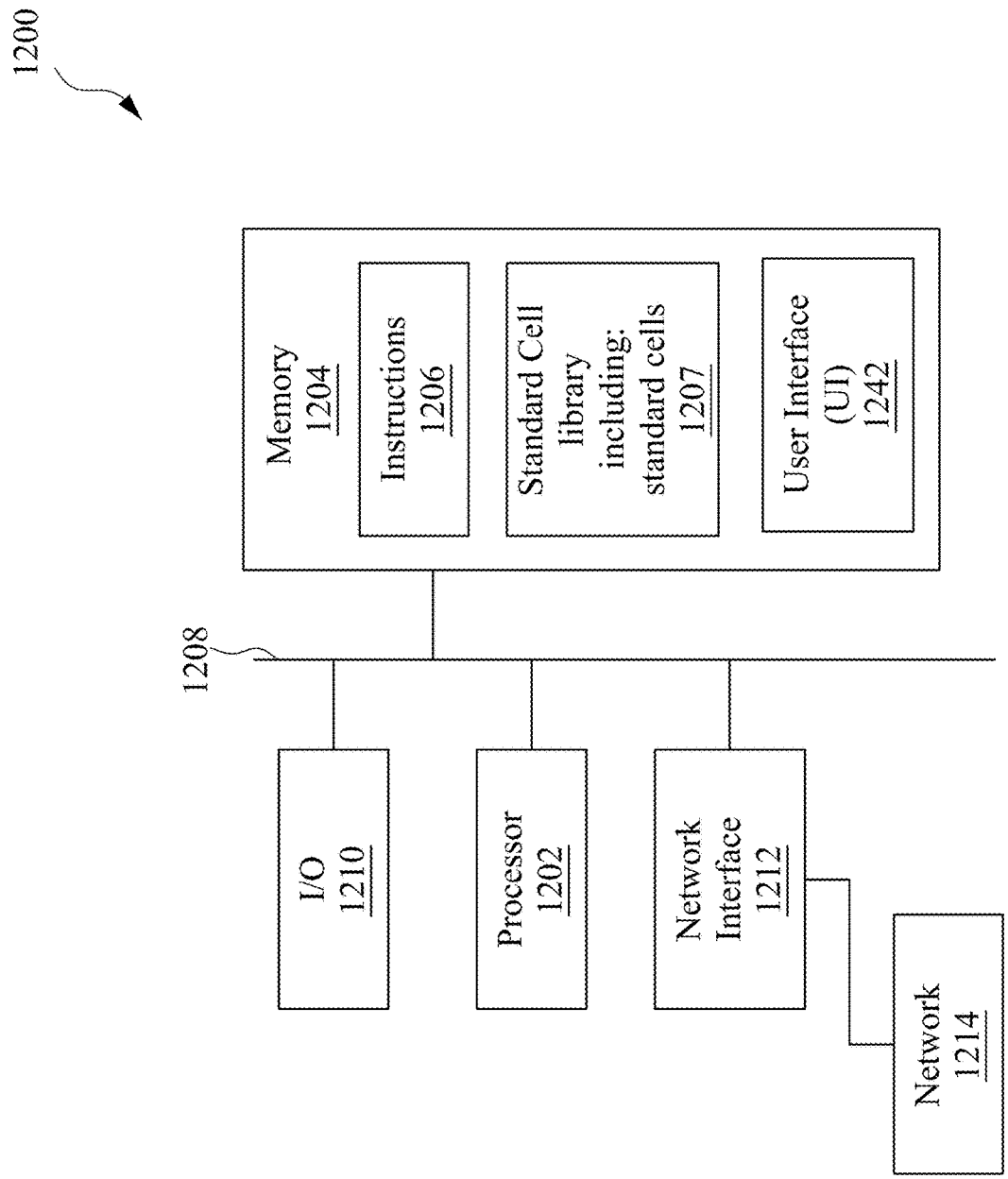
FIG. 12 is a block diagram of an electronic design automation (EDA) system in accordance with some embodiments.

FIG. 12 is a block diagram of an electronic design automation (EDA) system 1200 in accordance with some embodiments.

In some embodiments, EDA system 1200 includes an APR system. Methods described herein of designing layout diagrams represent wire routing arrangements, in accordance with one or more embodiments, are implementable, for example, using EDA system 1200, in accordance with some embodiments.

In some embodiments, EDA system 1200 is a general purpose computing device including a hardware processor 1202 and a non-transitory, computer-readable storage medium 1204. Storage medium 1204, amongst other things, is encoded with, i.e., stores, computer program code 1206, i.e., a set of executable instructions. Execution of instructions 1206 by hardware processor 1202 represents (at least in part) an EDA tool which implements a portion or all of the methods described herein in accordance with one or more embodiments (hereinafter, the noted processes and/or methods).

Processor 1202 is electrically coupled to computer-readable storage medium 1204 via a bus 1208. Processor 1202 is also electrically coupled to an I/O interface 1210 by bus 1208. A network interface 1212 is also electrically connected to processor 1202 via bus 1208. Network interface 1212 is connected to a network 1214, so that processor 1202 and computer-readable storage medium 1204 are capable of connecting to external elements via network 1214. Processor 1202 is configured to execute computer program code 1206 encoded in computer-readable storage medium 1204 in order to cause system 1200 to be usable for performing a portion or all of the noted processes and/or methods. In one or more embodiments, processor 1202 is a central processing unit (CPU), a multi-processor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, storage medium 1204 stores computer program code 1206 configured to cause system 1200 (where such execution represents (at least in part) the EDA tool) to be usable for performing a portion or all of the noted processes and/or methods. In one or more embodiments, storage medium 1204 also stores information which facilitates performing a portion or all of the noted processes and/or methods. In one or more embodiments, storage medium 1204 stores library 1207 of standard cells including such standard cells as disclosed herein.

EDA system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

EDA system 1200 also includes network interface 1212 coupled to processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1200.

System 1200 is configured to receive information through I/O interface 1210. The information received through I/O interface 1210 includes one or more of instructions, data, design rules, libraries of standard cells, and/or other parameters for processing by processor 1202. The information is transferred to processor 1202 via bus 1208. EDA system 1200 is configured to receive information related to a UI through I/O interface 1210. The information is stored in computer-readable medium 1204 as user interface (UI) 1242.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1200. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 13:
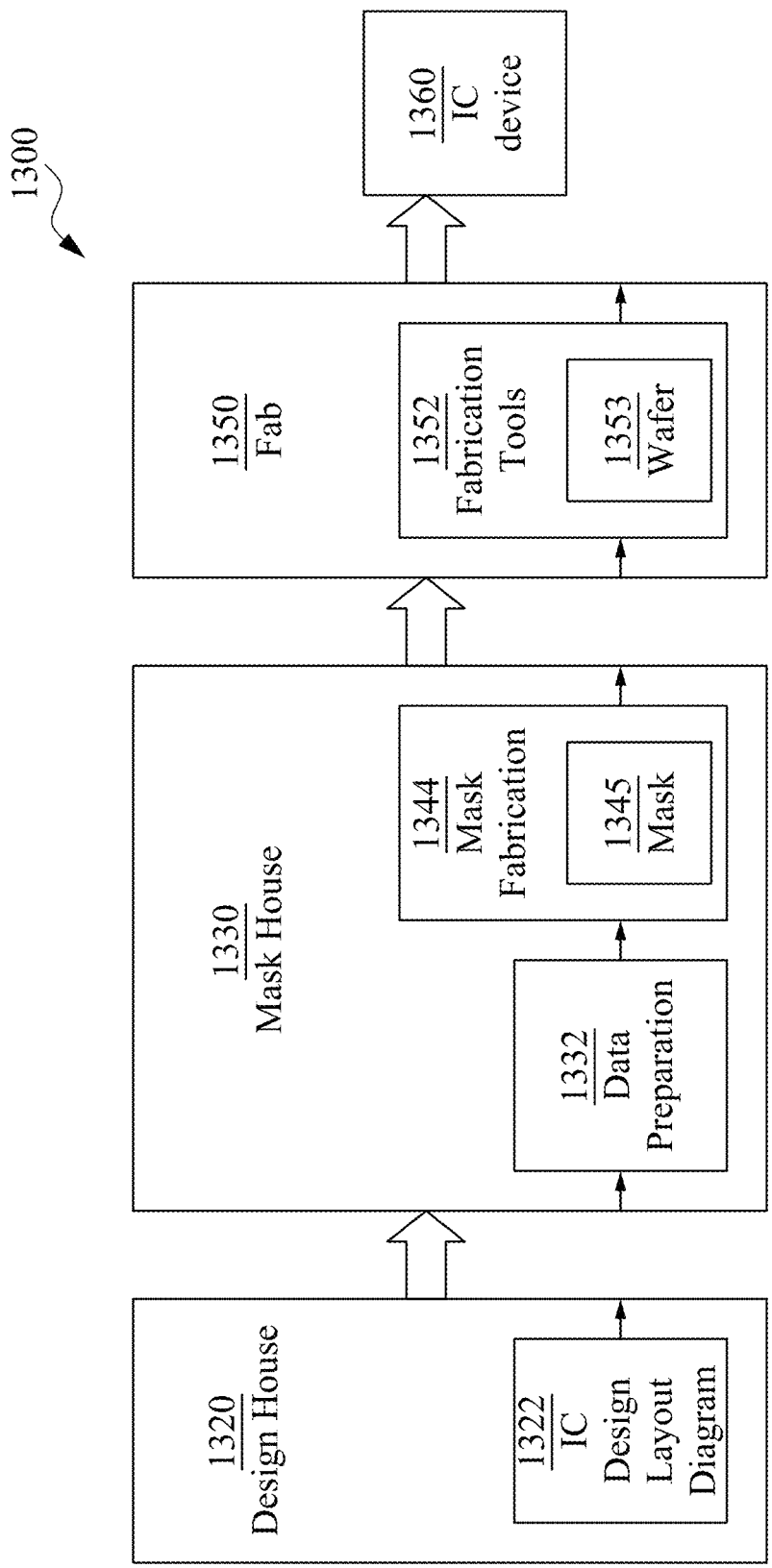
FIG. 13 is a block diagram of an IC device manufacturing system, and an IC manufacturing flow associated therewith, in accordance with some embodiments.

FIG. 13 is a block diagram of an integrated circuit (IC) manufacturing system 1300, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1300.

In FIG. 13, IC manufacturing system 1300 includes entities, such as a design house 1320, a mask house 1330, and an IC manufacturer/fabricator ("fab") 1350, that interact with one another in the design, development, and manufacturing cycles and/or services related to manufacturing an IC device 1360. The entities in system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1320, mask house 1330, and IC fab 1350 is owned by a single larger company. In some embodiments, two or more of design house 1320, mask house 1330, and IC fab 1350 coexist in a common facility and use common resources.

Design house (or design team) 1320 generates an IC design layout diagram 1322. IC design layout diagram 1322 includes various geometrical patterns designed for an IC device 1360. The geometrical patterns correspond to patterns of metal, oxide, or semiconductor layers that make up the various components of IC device 1360 to be fabricated. The various layers combine to form various IC features. For example, a portion of IC design layout diagram 1322 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1320 implements a proper design procedure to form IC design layout diagram 1322. The design procedure includes one or more of logic design, physical design or place-and-route operation. IC design layout diagram 1322 is presented in one or more data files having information of the geometrical patterns. For example, IC design layout diagram 1322 can be expressed in a GDSII file format or DFII file format.

Mask house 1330 includes data preparation 1332 and mask fabrication 1344. Mask house 1330 uses IC design layout diagram 1322 to manufacture one or more masks 1345 to be used for fabricating the various layers of IC device 1360 according to IC design layout diagram 1322. Mask house 1330 performs mask data preparation 1332, where IC design layout diagram 1322 is translated into a representative data file ("RDF"). Mask data preparation 1332 provides the RDF to mask fabrication 1344. Mask fabrication 1344 includes a mask writer. A mask writer converts the RDF to an image on a substrate, such as a mask (reticle) 1345 or a semiconductor wafer 1353. The design layout diagram 1322 is manipulated by mask data preparation 1332 to comply with particular characteristics of the mask writer and/or requirements of IC fab 1350. In FIG. 13, mask data preparation 1332 and mask fabrication 1344 are illustrated as separate elements. In some embodiments, mask data preparation 1332 and mask fabrication 1344 can be collectively referred to as mask data preparation.

In some embodiments, mask data preparation 1332 includes optical proximity correction (OPC) which uses lithography enhancement techniques to compensate for image errors, such as those that can arise from diffraction, interference, other process effects and the like. OPC adjusts IC design layout diagram 1322. In some embodiments, mask data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1332 includes a mask rule checker (MRC) that checks the IC design layout diagram 1322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1322 to compensate for limitations during mask fabrication 1344, which may undo part of the modifications performed by OPC in order to meet mask creation rules.

In some embodiments, mask data preparation 1332 includes lithography process checking (LPC) that simulates processing that will be implemented by IC fab 1350 to fabricate IC device 1360. LPC simulates this processing based on IC design layout diagram 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1322.

It should be understood that the above description of mask data preparation 1332 has been simplified for the purposes of clarity. In some embodiments, data preparation 1332 includes additional features such as a logic operation (LOP) to modify the IC design layout diagram 1322 according to manufacturing rules. Additionally, the processes applied to IC design layout diagram 1322 during data preparation 1332 may be executed in a variety of different orders.

After mask data preparation 1332 and during mask fabrication 1344, a mask 1345 or a group of masks 1345 are fabricated based on the modified IC design layout diagram 1322. In some embodiments, mask fabrication 1344 includes performing one or more lithographic exposures based on IC design layout diagram 1322. In some embodiments, an electron-beam (e-beam) or a mechanism of multiple e-beams is used to form a pattern on a mask (photomask or reticle) 1345 based on the modified IC design layout diagram 1322. Mask 1345 can be formed in various technologies. In some embodiments, mask 1345 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1345 includes a transparent substrate (e.g., fused quartz) and an opaque material (e.g., chromium) coated in the opaque regions of the binary mask. In another example, mask 1345 is formed using a phase shift technology. In a phase shift mask (PSM) version of mask 1345, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1344 is used in a variety of processes. For example, such a mask(s) is used in an ion implantation process to form various doped regions in semiconductor wafer 1353, in an etching process to form various etching regions in semiconductor wafer 1353, and/or in other suitable processes.

IC fab 1350 is an IC fabrication business that includes one or more manufacturing facilities for the fabrication of a variety of different IC products. In some embodiments, IC Fab 1350 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1350 includes fabrication tools 1352 configured to execute various manufacturing operations on semiconductor wafer 1353 such that IC device 1360 is fabricated in accordance with the mask(s), e.g., mask 1345. In various embodiments, fabrication tools 1352 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1350 uses mask(s) 1345 fabricated by mask house 1330 to fabricate IC device 1360. Thus, IC fab 1350 at least indirectly uses IC design layout diagram 1322 to fabricate IC device 1360. In some embodiments, semiconductor wafer 1353 is fabricated by IC fab 1350 using mask(s) 1345 to form IC device 1360. In some embodiments, the IC fabrication includes performing one or more lithographic exposures based at least indirectly on IC design layout diagram 1322. Semiconductor wafer 1353 includes a silicon substrate or other proper substrate having material layers formed thereon. Semiconductor wafer 1353 further includes one or more of various doped regions, dielectric features, multi-level interconnects, and the like (formed at subsequent manufacturing steps).

Details regarding an integrated circuit (IC) manufacturing system (e.g., system 1300 of FIG. 13), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In an embodiment, an integrated circuit (IC) device comprises a circuit region, a lower metal layer over the circuit region, and an upper metal layer over the lower metal layer. The lower metal layer comprises a plurality of lower conductive patterns elongated along a first axis. The upper metal layer comprises a plurality of upper conductive patterns elongated along a second axis transverse to the first axis. The plurality of upper conductive patterns comprises at least one input or output configured to electrically couple the circuit region to external circuitry outside the circuit region. The upper metal layer further comprises a first lateral upper conductive pattern contiguous with and projecting, along the first axis, from a first upper conductive pattern among the plurality of upper conductive patterns. The first lateral upper conductive pattern is over and electrically coupled to a first lower conductive pattern among the plurality of lower conductive patterns.

In an embodiment, a method of manufacturing an IC device comprises depositing a lower metal layer over a substrate having thereon a plurality of transistors, patterning the lower metal layer to form a plurality of lower conductive patterns elongated along a first axis, depositing an upper metal layer over the lower metal layer, and patterning the upper metal layer. The patterning the upper metal layer forms a plurality of upper conductive patterns elongated along a second axis transverse to the first axis, and a first lateral upper conductive pattern contiguous with and projecting, along the first axis, from a first upper conductive pattern among the plurality of upper conductive patterns.

In an embodiment, a system comprises at least one processor, and at least one memory that stores computer program code for one or more programs. When the at least one processor executes the computer program code stored in the at least one memory, the computer program code and the at least one processor are configured to cause the system to generate a layout diagram of an IC device, the layout diagram being stored on a non-transitory computer-readable medium. The generating the layout diagram comprises placing a first cell in abutment with a second cell in the layout diagram. At least one of the first cell or the second cell comprises a plurality of active regions, a plurality of gate regions over and transverse to the plurality of active regions, a lower metal layer over the plurality of gate regions, and an upper metal layer over the lower metal layer. The upper metal layer comprises an L-shaped or bracket-shaped upper conductive pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
   a circuit region;
   a lower metal layer over the circuit region in a thickness direction of the IC device, and comprising a plurality of lower conductive patterns elongated along a first axis; and
   an upper metal layer over the lower metal layer in the thickness direction, and comprising:
      a plurality of upper conductive patterns elongated along a second axis transverse to the first axis, the plurality of upper conductive patterns comprising at least one input or output configured to electrically couple the circuit region to external circuitry outside the circuit region, and
      a first lateral upper conductive pattern contiguous with and projecting, along the first axis, from a first upper conductive pattern other than the output among the plurality of upper conductive patterns, the first lateral upper conductive pattern overlapping, in the thickness direction, and electrically coupled to a first lower conductive pattern among the plurality of lower conductive patterns,
   wherein, along the second axis, a dimension of the first lower conductive pattern is smaller than a dimension of the first lateral upper conductive pattern overlapping the first lower conductive pattern.

2. The IC device of claim 1, further comprising:
   a plurality of via structures between the upper metal layer and the lower metal layer, the plurality of via structures comprising a first via structure which overlaps, in the thickness direction, and is electrically coupled to
      the first lateral upper conductive pattern, and
      the first lower conductive pattern.

3. The IC device of claim 2, wherein
   the first upper conductive pattern overlaps, in the thickness direction, and is electrically coupled to
      a second via structure among the plurality of via structures, and
      a second lower conductive pattern among the plurality of lower conductive patterns.

4. The IC device of claim 2, wherein
   the first lateral upper conductive pattern is contiguous with and projects from a first portion of the first upper conductive pattern, and
   the upper metal layer further comprises a second lateral upper conductive pattern contiguous with and projecting, along the first axis, from a second portion of the first upper conductive pattern, the second portion different from the first portion.

5. The IC device of claim 4, wherein
   the second lateral upper conductive pattern overlaps, in the thickness direction, and is electrically coupled to
      a second via structure among the plurality of via structures, and
      a second lower conductive pattern among the plurality of lower conductive patterns.

6. The IC device of claim 5,
   wherein
   the plurality of lower conductive patterns comprises, along the second axis and between the first lower conductive pattern and the second lower conductive pattern, third through fifth lower conductive patterns,
   the fourth lower conductive pattern is located between and directly adjacent the third lower conductive pattern and the fifth lower conductive pattern along the second axis,
   the plurality of upper conductive patterns comprises a second upper conductive pattern over the third through fifth lower conductive patterns, and
   the plurality of via structures further comprises:
   third through fifth via structures electrically coupling the second upper conductive pattern correspondingly with the third through fifth lower conductive patterns.

7. The IC device of claim 6, wherein
   the first lateral upper conductive pattern and the second lateral upper conductive pattern project, along the first axis, from the first upper conductive pattern toward the third through fifth via structures.

8. The IC device of claim 7, wherein
   the circuit region comprises a plurality of transistors, and
   the plurality of transistors is electrically coupled by the plurality of lower conductive pattern, the plurality of upper conductive patterns, the first and second lateral conductive patterns, and the plurality of via structures including the first through fifth via structures, to form a scan D-flip-flop.

9. The IC device of claim 1, further comprising:
   a plurality of via structures between the upper metal layer and the lower metal layer,
   wherein
   the circuit region comprises a plurality of transistors, and
   the plurality of transistors is electrically coupled by the plurality of lower conductive pattern, the plurality of upper conductive patterns, the first lateral conductive pattern, and the plurality of via structures, to form an AND-OR-Invert (AOI) logic with two 2-input AND gates.

10. The IC device of claim 1, wherein
    the first lateral upper conductive pattern overlaps, along the second axis, less than a whole width of a second upper conductive pattern among the plurality of upper conductive patterns, and
    the first upper conductive pattern and the second upper conductive pattern are directly adjacent.

11. The IC device of claim 1, wherein
    the first lateral upper conductive pattern overlaps, along the second axis, a whole width of a second upper conductive pattern among the plurality of upper conductive patterns, and
    the first upper conductive pattern and the second upper conductive pattern are directly adjacent.

12. The IC device of claim 1, wherein
the lower metal layer is a metal-zero (M0) layer, and the upper metal layer is a metal-one (M1) layer.

13. An integrated circuit (IC) device, comprising:
a substrate having thereon a plurality of transistors;
a lower metal layer over the substrate and comprising a plurality of lower conductive patterns elongated along a first axis; and
an upper metal layer over the lower metal layer and comprising:
  a plurality of upper conductive patterns elongated along a second axis transverse to the first axis, and
  a first lateral upper conductive pattern contiguous with and projecting, along the first axis, from a first upper conductive pattern among the plurality of upper conductive patterns,
wherein the first lateral upper conductive pattern overlaps, along the second axis, a second upper conductive pattern among the plurality of upper conductive patterns, the second upper conductive pattern different from the first upper conductive pattern,
wherein the upper metal layer further comprises a third upper conductive pattern which
  is over first through third lower conductive patterns among the plurality of lower conductive patterns, and
  is electrically coupled to the first through third lower conductive patterns correspondingly by first through third via structures, and
wherein the second lower conductive pattern is located between and directly adjacent the first lower conductive pattern and the third lower conductive pattern along the second axis.

14. The IC device of claim 13, further comprising:
a plurality of contact structures electrically coupling the plurality of lower conductive patterns to the plurality of transistors; and
a plurality of via structures electrically coupling the plurality of upper conductive patterns to the plurality of lower conductive patterns, the plurality of via structures comprising the first through third via structures.

15. The IC device of claim 13, wherein
the first lateral upper conductive pattern overlaps, along the second axis, less than a whole width of the second upper conductive pattern, and
the first upper conductive pattern and the second upper conductive pattern are directly adjacent.

16. The IC device of claim 14, wherein
the first lateral upper conductive pattern
  projects, along the first axis, from a first portion of the first upper conductive pattern to be over a fourth lower conductive pattern among the plurality of lower conductive patterns, and
  is electrically coupled to the fourth lower conductive pattern by a fourth via structure among the plurality of via structures.

17. The IC device of claim 16, wherein
the upper metal layer further comprises a second lateral upper conductive pattern which
  is contiguous with and projects, along the first axis, from a second portion of the first upper conductive pattern, to be over a fifth lower conductive pattern among the plurality of lower conductive patterns, the second portion different from the first portion, and
  is electrically coupled to the fifth lower conductive pattern by a fifth via structure among the plurality of via structures.

18. The IC device of claim 13, wherein
the upper metal layer further comprises a fourth upper conductive pattern which
  is over the first through third lower conductive patterns, and
  is electrically coupled to the first through third lower conductive patterns correspondingly by fourth through sixth via structures.

19. A system, comprising:
at least one processor; and
at least one memory that stores computer program code for one or more programs,
wherein
when the at least one processor executes the computer program code stored in the at least one memory, the computer program code and the at least one processor are configured to cause the system to generate a layout diagram of an integrated circuit (IC) device, the layout diagram being stored on a non-transitory computer-readable medium,
the generating the layout diagram comprises placing a first cell in abutment with a second cell in the layout diagram, and
at least one of the first cell or the second cell comprises:
  a plurality of active regions elongated along a first axis;
  a plurality of gate regions over and transverse to the plurality of active regions;
  a lower metal layer over the plurality of gate regions; and
  an upper metal layer over the lower metal layer, the upper metal layer comprising:
    a plurality of upper conductive patterns elongated along a second axis transverse to the first axis, and
    a first lateral upper conductive pattern contiguous with and projecting, along the first axis, from a first upper conductive pattern among the plurality of upper conductive patterns, wherein the first lateral upper conductive pattern overlaps, along the second axis, less than a whole width of a second upper conductive pattern among the plurality of upper conductive patterns.

20. The system of claim 19, wherein
the lower metal layer comprises a plurality of lower conductive patterns elongated along the first axis,
the first lateral upper conductive pattern overlaps, in a thickness direction of the IC device a first lower conductive pattern among the plurality of lower conductive patterns,
along the second axis, a dimension of the first lower conductive pattern is smaller than a dimension of the first lateral upper conductive pattern overlapping the first lower conductive pattern,
the IC device comprises a plurality of metal layers over the plurality of gate regions in the thickness direction, and
among the plurality of metal layers,
  the lower metal layer is a metal layer closest to the plurality of gate regions, and
  the upper metal layer is a metal layer second closest to the plurality of gate regions.

\* \* \* \* \*